United States Patent
Lee et al.

(10) Patent No.: US 9,130,175 B2
(45) Date of Patent: Sep. 8, 2015

(54) ORGANIC PHOTOELECTRIC DEVICE AND IMAGE SENSOR EACH HAVING ACTIVE LAYER INCLUDING QUINACRIDONE AND SUBPC COMPOUNDS

(71) Applicant: Samsung Electronics Co., Ltd., Suwon-Si, Gyeonggi-Do (KR)

(72) Inventors: Kwang Hee Lee, Yongin-si (KR); Dong-Seok Leem, Hwaseong-si (KR); Kyu Sik Kim, Yongin-si (KR); Kyung Bae Park, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/089,987

(22) Filed: Nov. 26, 2013

(65) Prior Publication Data
US 2014/0346466 A1    Nov. 27, 2014

(30) Foreign Application Priority Data
May 27, 2013 (KR) .................. 10-2013-0059709

(51) Int. Cl.
| | | |
|---|---|---|
| H01L 29/08 | (2006.01) | |
| H01L 35/24 | (2006.01) | |
| H01L 51/00 | (2006.01) | |
| H01L 31/102 | (2006.01) | |
| H01J 1/62 | (2006.01) | |
| H01J 63/04 | (2006.01) | |
| H01L 51/40 | (2006.01) | |
| H01L 51/42 | (2006.01) | |
| H01L 27/30 | (2006.01) | |

(52) U.S. Cl.
CPC .......... *H01L 51/0072* (2013.01); *H01L 51/008* (2013.01); *H01L 51/0059* (2013.01); *H01L 27/307* (2013.01); *H01L 51/4253* (2013.01)

(58) Field of Classification Search
None
See application file for complete search history.

(56) References Cited

U.S. PATENT DOCUMENTS

| | | | |
|---|---|---|---|
| 6,368,395 B1 | 4/2002 | Nohr et al. | |
| 2009/0223566 A1* | 9/2009 | Mitsui et al. | 136/263 |
| 2010/0036134 A1 | 2/2010 | Mori et al. | |
| 2011/0253992 A1 | 10/2011 | Rand et al. | |
| 2012/0090685 A1 | 4/2012 | Forrest et al. | |

(Continued)

FOREIGN PATENT DOCUMENTS

| | | |
|---|---|---|
| JP | 11-024255 A | 1/1999 |
| JP | 2006-124593 A | 5/2006 |
| JP | 2007-063437 A | 3/2007 |

(Continued)

OTHER PUBLICATIONS

Morse, G. E. in "Engineering Boronsubphthalocyanine for Organic Electronic Applications," (2012), Doctoral Thesis, Chemical Engineering and Applied Chemistry, University of Toronto, pp. 1-358.*

(Continued)

*Primary Examiner* — Michael Jung
(74) *Attorney, Agent, or Firm* — Harness, Dickey & Pierce, P.L.C.

(57) ABSTRACT

An organic photoelectronic device includes a first electrode and a second electrode facing each other, and an active layer between the first electrode and the second electrode, the active layer including a compound represented by Chemical Formula 1 or Chemical Formula 2, and a compound represented by Chemical Formula 3.

19 Claims, 15 Drawing Sheets

(56) References Cited

U.S. PATENT DOCUMENTS

2013/0112947 A1\* 5/2013 Lee et al. .................. 257/40
2014/0097416 A1\* 4/2014 Lee et al. .................. 257/40

FOREIGN PATENT DOCUMENTS

| | | |
|---|---|---|
| JP | 2008-206016 A | 9/2008 |
| JP | 2011-032443 A | 2/2011 |
| JP | 2011-140639 A | 7/2011 |

OTHER PUBLICATIONS

Sec H. et al. "Color Sensors with Three Vertically Stacked Organic Photocletectors"; The Japan Society of Applied Physics; Japanese Journal of Applied Physics, vol. 46, No. 49, 2007, pp. L1240-L1242; 2007.

Aihara, S. et al. "Stacked Image Sensor With Green- and Red-Sensitive Organic Photoconductive Films Applying Zinc Oxide Thin-Film Transistors to a Signal Readout Circuit"; Institute of Electrical and Electronics Engineers; Transactions on Electron Devices, vol. 56, No. 11, p. 2570-2576; Nov. 2009.

Ihama, M. et al. "CMOS image Sensor with a Thin Overlaid Panchromatic Organic Photoconductive Layer for Sensors with Reduced Pixel Size"; FUJIFILM Corporation; International Display Workshops, p. 2123-2126; 2009.

Baierl, D. et al. "A hybrid CMOS-imager with a solutionprocessable polymer as photoactive layer"; Macmillan Publishers Limited; Nature Communications, vol. 3, article 1175, p. 1-8; 2012.

Lee, K. et al. "A high performance green-sensitive organic photodiode comprising a bulk heterojunction of dimethylquinacridone and dicyanovinyl terthiophene"; Royal Society of Chemistry Publishing; Journal of Materials Chemistry c, vol. 1, p. 2666-2671; 2013.

Korean Search Report dated Jan. 21, 2013.

\* cited by examiner

ORGANIC PHOTOELECTRIC DEVICE AND IMAGE SENSOR EACH HAVING ACTIVE LAYER INCLUDING QUINACRIDONE AND SUBPC COMPOUNDS

CROSS REFERENCE TO RELATED APPLICATION

This application claims priority to and the benefit of Korean Patent Application No. 10-2013-0059709 filed in the Korean Intellectual Property Office on May 27, 2013, the entire contents of which are incorporated herein by reference.

BACKGROUND

1. Field

Example embodiments provide an organic photoelectronic device and an image sensor including the same.

2. Description of the Related Art

A photoelectronic device refers to a device for converting light into an electrical signal using photoelectric effects. The photoelectronic device may include a photodiode and/or a phototransistor, and may be applied to an image sensor and/or a solar cell.

An image sensor including a photodiode requires higher resolution and accordingly a smaller pixel. At present, a silicon photodiode is widely used, but has a problem of deteriorated sensitivity since the silicon photodiode has a smaller absorption area due to smaller pixels. Accordingly, an organic material that is capable of replacing silicon has been researched.

Example embodiments provide an organic photoelectronic device selectively absorbing light in a green wavelength region and improving efficiency.

Example embodiments also provide an image sensor including the organic photoelectronic device.

The organic material of the organic photoelectronic device has a relatively high extinction coefficient and selectively absorbs light in a particular wavelength region depending on a molecular structure, and thus may simultaneously replace a photodiode and a color filter and resultantly improve sensitivity and contribute to higher integration.

SUMMARY

According to example embodiments, an organic photoelectronic device includes a first electrode and a second electrode facing each other, and an active layer between the first electrode and the second electrode, the active layer including a compound represented by the following Chemical Formula 1 or the following Chemical Formula 2 and a compound represented by the following Chemical Formula 3.

[Chemical Formula 1]

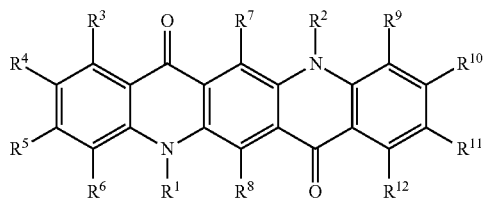

In the Chemical Formula 1, each of $R^1$ and $R^2$ are independently one of hydrogen, a substituted or unsubstituted $C_1$ to $C_{30}$ alkyl group, a substituted or unsubstituted $C_6$ to $C_{30}$ aryl group, a substituted or unsubstituted $C_3$ to $C_{30}$ heteroaryl group, a substituted or unsubstituted $C_1$ to $C_{30}$ alkoxy group, and a combination thereof, and each of $R^3$ to $R^{12}$ are independently one of hydrogen, a substituted or unsubstituted $C_1$ to $C_{30}$ alkyl group, a substituted or unsubstituted $C_6$ to $C_{30}$ aryl group, a substituted or unsubstituted $C_3$ to $C_{30}$ heteroaryl group, a substituted or unsubstituted $C_1$ to $C_{30}$ alkoxy group, a halogen atom, a halogen-containing group, and a combination thereof.

[Chemical Formula 2]

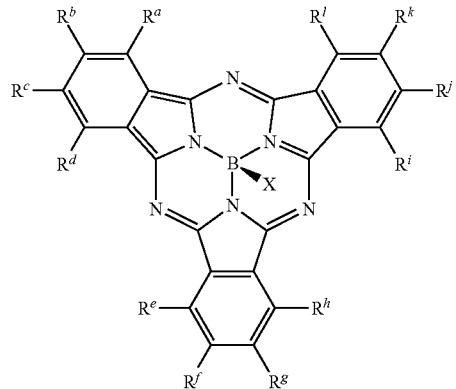

In the Chemical Formula 2, each of $R^a$ to $R^l$ are independently one of hydrogen, a substituted or unsubstituted $C_1$ to $C_{30}$ alkyl group, a substituted or unsubstituted $C_6$ to $C_{30}$ aryl group, a substituted or unsubstituted $C_3$ to $C_{30}$ heteroaryl group, a halogen atom, a halogen-containing group, and a combination thereof, and X is halide.

[Chemical Formula 3]

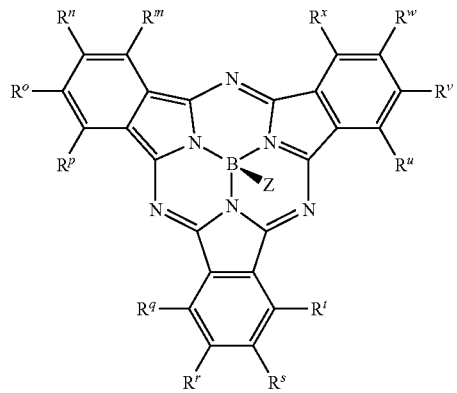

In the Chemical Formula 3, each of $R^m$ to $R^y$ are independently one of hydrogen, a substituted or unsubstituted $C_1$ to $C_{30}$ alkyl group, a substituted or unsubstituted $C_6$ to $C_{30}$ aryl group, a substituted or unsubstituted $C_3$ to $C_{30}$ heteroaryl group, a halogen atom, a halogen-containing group, and a combination thereof, and Z is a $C_6$ to $C_{20}$ aryloxy group having at least one halogen atom.

The Z of the Chemical Formula 3 may be a phenoxy group having at least one fluorine atom.

The Z of the Chemical Formula 3 may be represented by the following Chemical Formula A.

[Chemical Formula A]

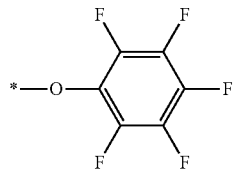

Each of the $R^m$ to $R^y$ of the Chemical Formula 3 may independently be one of hydrogen, or at least one thereof may include a halogen atom.

The compound represented by the Chemical Formula 3 may include at least one selected from compounds represented by the following Chemical Formula 3a or Chemical Formula 3b.

[Chemical Formula 3a]

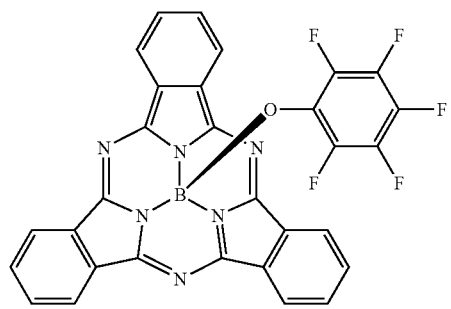

[Chemical Formula 3b]

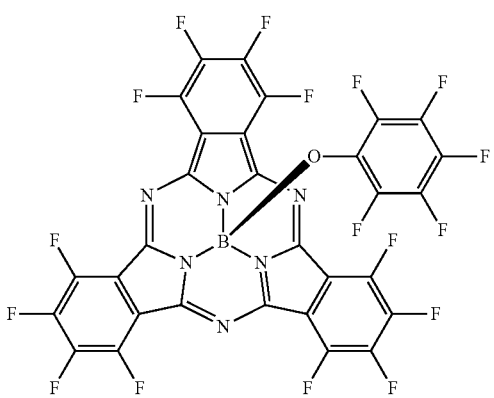

The compound represented by the Chemical Formula 1 may include at least one selected from compounds represented by the following Chemical Formulae 1a to 1e.

[Chemical Formula 1a]

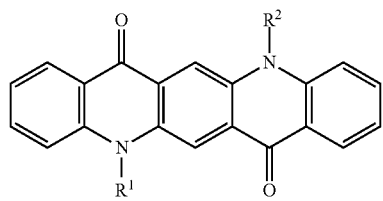

[Chemical Formula 1b]

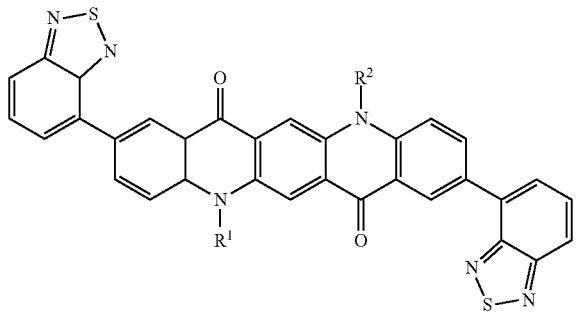

[Chemical Formula 1c]

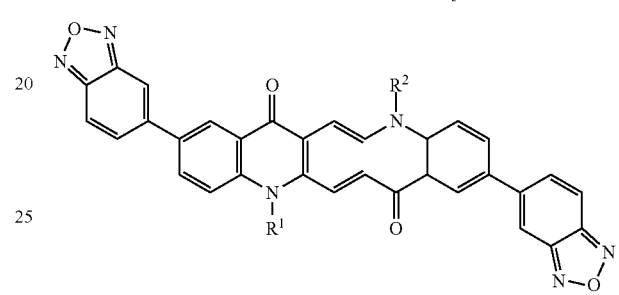

[Chemical Formula 1d]

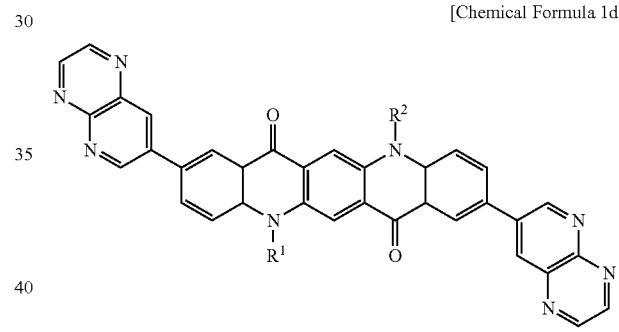

[Chemical Formula 1e]

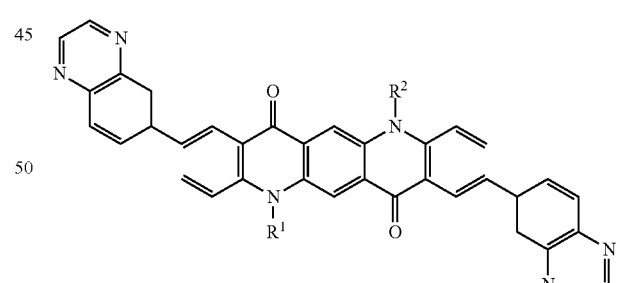

In Chemical Formulae 1a to 1e, each of $R^1$ and $R^2$ are independently one of hydrogen, a substituted or unsubstituted $C_1$ to $C_{30}$ alkyl group, a substituted or unsubstituted $C_6$ to $C_{30}$ aryl group, a substituted or unsubstituted $C_3$ to $C_{30}$ heteroaryl group, and a combination thereof.

The compound represented by the Chemical Formula 2 may include at least one selected from compounds represented by the following Chemical Formulae 2a to 2e.

[Chemical Formula 2a]

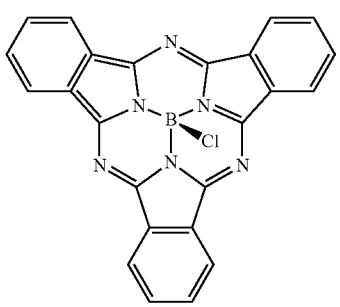

[Chemical Formula 2b]

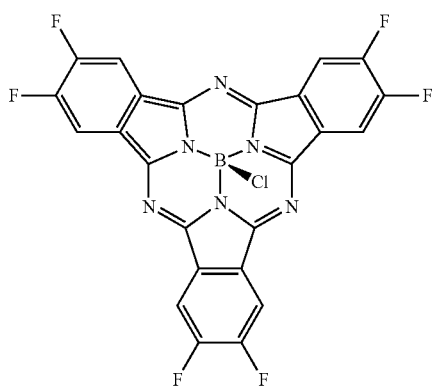

[Chemical Formula 2c]

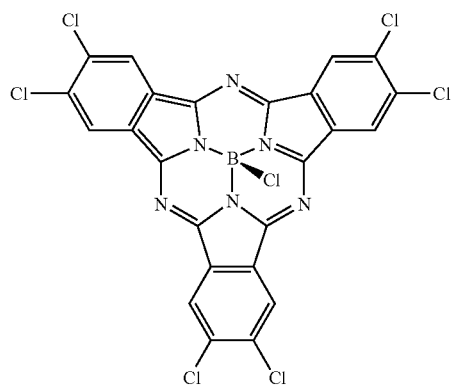

[Chemical Formula 2d]

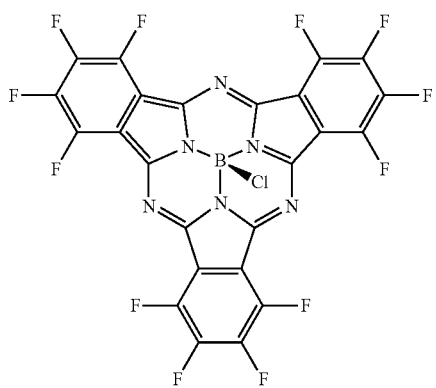

[Chemical Formula 2e]

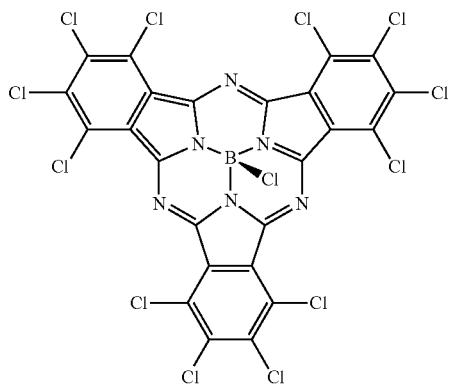

The compound represented by the Chemical Formula 1 or 2 may be a p-type semiconductor, and the compound represented by the Chemical Formula 3 may be an n-type semiconductor.

The active layer may selectively absorb light in a green wavelength region.

The active layer may have a maximum absorption peak in a wavelength region of about 500 nm to about 600 nm.

The active layer may include an intrinsic layer including the compound represented by the Chemical Formula 1 or 2 and the compound represented by the Chemical Formula 3 at a ratio of about 1:100 to about 100:1.

The active layer may include an intrinsic layer including the compound represented by the Chemical Formula 1 or 2 and the compound represented by the Chemical Formula 3 at a ratio of about 1:10 to about 10:1.

The active layer may further include a p-type layer including the compound represented by the Chemical Formula 1 or 2.

The active layer may further include an n-type layer including the compound represented by the Chemical Formula 3.

The active layer may further include a p-type layer on one side of the intrinsic layer and including the compound represented by the Chemical Formula 1 or 2 and an n-type layer on the other side of the intrinsic layer and including the compound represented by the Chemical Formula 3.

The active layer may include a p-type layer including the compound represented by the Chemical Formula 1 or 2 and an n-type layer including the compound represented by the Chemical Formula 3.

The organic photoelectronic device may further include a charge auxiliary layer between at least one of the first electrode and the active layer, and the second electrode and the active layer.

The first electrode may be an anode and the second electrode may be a cathode.

According to example embodiments, an image sensor includes the organic photoelectronic device of example embodiments.

DETAILED DESCRIPTION

Figure 1:
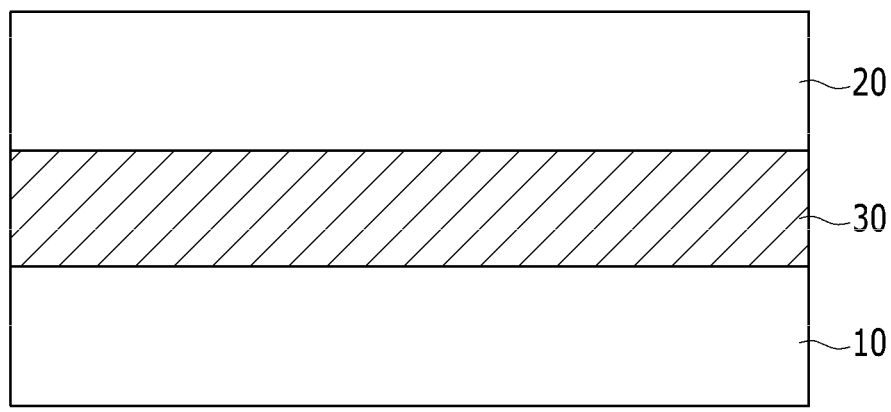
FIG. 1 is a cross-sectional view showing an organic photoelectronic device according to example embodiments.

Hereinafter, example embodiments will be described in detail so that a person skilled in the art would understand them. However, this disclosure may be embodied in many different forms, and is not construed as limited to the example embodiments set forth herein.

As used herein, when a definition is not otherwise provided, the term "substituted" refers to one substituted with at least a functional group selected from a halogen (F, Br, Cl, or I), a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid group or a salt thereof, a $C_1$ to $C_{20}$ alkyl group, a $C_2$ to $C_{20}$ alkenyl group, a $C_2$ to $C_{20}$ alkynyl group, a $C_6$ to $C_{30}$ aryl group, a $C_7$ to $C_{30}$ arylalkyl group, a $C_1$ to $C_4$ alkoxy group, a $C_1$ to $C_{20}$ heteroalkyl group, a $C_3$ to $C_{20}$ heteroarylalkyl group, a $C_3$ to $C_{30}$ cycloalkyl group, a $C_3$ to $C_{15}$ cycloalkenyl group, a $C_6$ to $C_{15}$ cycloalkynyl group, a $C_2$ to $C_{20}$ heterocycloalkyl group, and a combination thereof, instead of hydrogen of a compound.

As used herein, when specific definition is not otherwise provided, the term "hetero" refers to one including 1 to 3 heteroatoms selected from N, O, S, and P.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It should be understood that, although the terms first, second, third, etc. may be used herein to describe various elements, components, regions, layers and/or sections, these elements, components, regions, layers, and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings of example embodiments.

Spatially relative terms (e.g., "beneath," "below," "lower," "above," "upper," and the like) may be used herein for ease of description to describe one element or feature's relationship to another element(s) or feature(s) as illustrated in the figures. It should be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" may encompass both an orientation of above and below. The device may be otherwise oriented (rotated 90 degrees or at other orientations) and the spatially relative descriptors used herein interpreted accordingly.

The terminology used herein is for the purpose of describing various embodiments only and is not intended to be limiting of example embodiments. As used herein, the singular forms "a," "an," and "the" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which example embodiments belong. It will be further understood that terms, including those defined in commonly used dictionaries, should be interpreted as having a meaning that is consistent with their meaning in the context of the relevant art and will not be interpreted in an idealized or overly formal sense unless expressly so defined herein.

An organic photoelectronic device according to example embodiments is described referring to FIG. 1. FIG. 1 is a cross-sectional view showing an organic photoelectronic device according to example embodiments.

Referring to FIG. 1, an organic photoelectronic device 100 according to example embodiments includes a first electrode (e.g., anode) 10 and a second electrode (e.g., cathode) 20 facing each other, and an active layer 30 interposed between the first electrode (e.g., anode) 10 and the second electrode (e.g., cathode) 20. FIG. 1 shows the first electrode (e.g., anode) 10 positioned beneath the active layer 30, while the second electrode (e.g., cathode) 20 is positioned on the active layer 30. However, the second electrode (e.g., cathode) 20 may be positioned beneath the active layer 30, and the first electrode (e.g., anode) 10 may be positioned on the active layer 30.

At least one of the first electrode (e.g., anode) 10 and second electrode (e.g., cathode) 20 may be a light transmission electrode, and the light transmission electrode may be made of, for example, a transparent conductor, e.g., indium tin oxide (ITO) and indium zinc oxide (IZO), a metal thin film having a thickness of several nanometers to tens of nanometers, or a metal thin film doped with a metal oxide having a thickness of several nanometers to tens of nanometers. The other of the first electrode (e.g., anode) 10 and second electrode (e.g., cathode) 20 may be made of, for example, an opaque conductor, e.g., aluminum (Al).

The active layer 30 includes a mixed p-type semiconductor material and n-type semiconductor material to form a pn junction, and externally receives light, produces excitons, and separates the excitons into holes and electrons.

The active layer 30 includes a compound represented by the following Chemical Formula 1 or 2, and a compound represented by the following Chemical Formula 3.

[Chemical Formula 1]

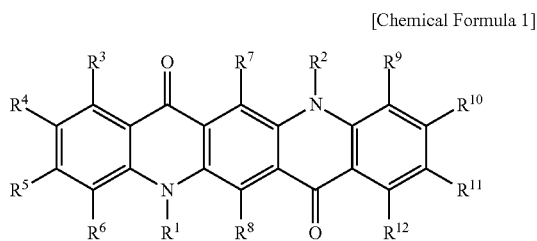

In the Chemical Formula 1, each of $R^1$ and $R^2$ are independently one of hydrogen, a substituted or unsubstituted $C_1$ to $C_{30}$ alkyl group, a substituted or unsubstituted $C_6$ to $C_{30}$ aryl group, a substituted or unsubstituted $C_3$ to $C_{30}$ heteroaryl group, a substituted or unsubstituted $C_1$ to $C_{30}$ alkoxy group, and a combination thereof, and each of $R^3$ to $R^{12}$ are independently one of hydrogen, a substituted or unsubstituted $C_1$ to $C_{30}$ alkyl group, a substituted or unsubstituted $C_6$ to $C_{30}$ aryl group, a substituted or unsubstituted $C_3$ to $C_{30}$ heteroaryl group, a substituted or unsubstituted $C_1$ to $C_{30}$ alkoxy group, a halogen atom, a halogen-containing group, and a combination thereof.

[Chemical Formula 2]

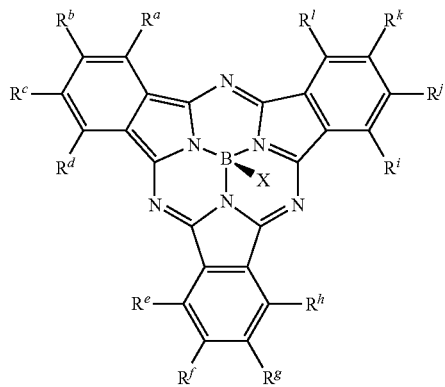

In the Chemical Formula 2, each of $R^a$ to $R^l$ are independently one of hydrogen, a substituted or unsubstituted $C_1$ to $C_{30}$ alkyl group, a substituted or unsubstituted $C_6$ to $C_{30}$ aryl group, a substituted or unsubstituted $C_3$ to $C_{30}$ heteroaryl group, a halogen atom, a halogen-containing group, and a combination thereof, and X is a halide.

[Chemical Formula 3]

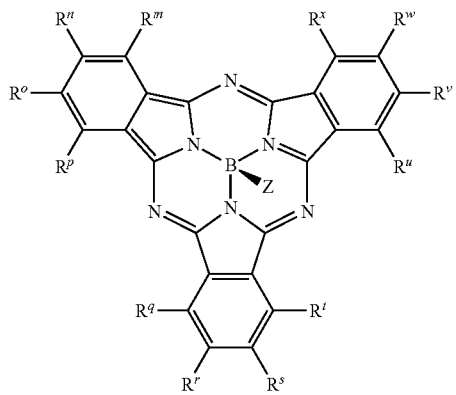

In the Chemical Formula 3, each of $R^m$ to $R^y$ are independently one of hydrogen, a substituted or unsubstituted $C_1$ to $C_{30}$ alkyl group, a substituted or unsubstituted $C_6$ to $C_{30}$ aryl group, a substituted or unsubstituted $C_3$ to $C_{30}$ heteroaryl group, a halogen atom, a halogen-containing group, and a combination thereof, and Z is a $C_6$ to $C_{20}$ aryloxy group including at least one halogen atom.

The compound represented by the Chemical Formula 1 may include at least one selected from compounds represented by the following Chemical Formulae 1a to 1e.

[Chemical Formula 1a]

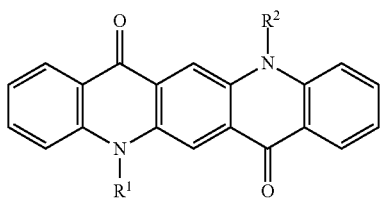

[Chemical Formula 1b]

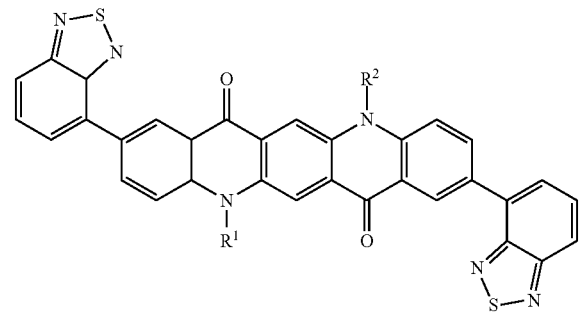

[Chemical Formula 1c]

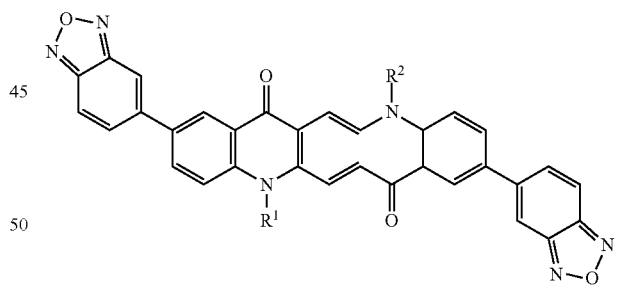

[Chemical Formula 1d]

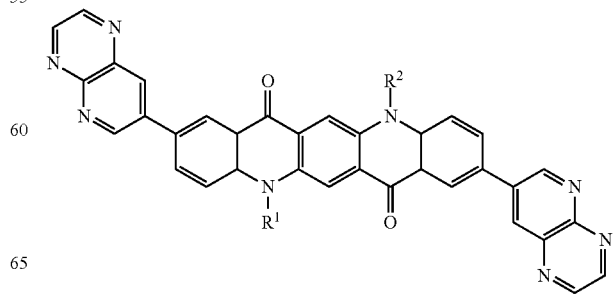

[Chemical Formula 1e]

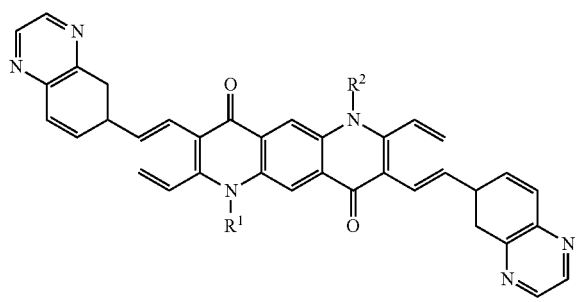

In the Chemical Formulae 1a to 1e, each of $R^1$ and $R^2$ are independently one of hydrogen, a substituted or unsubstituted $C_1$ to $C_{30}$ alkyl group, a substituted or unsubstituted $C_6$ to $C_{30}$ aryl group, a substituted or unsubstituted $C_3$ to $C_{30}$ heteroaryl group, and a combination thereof.

The compound represented by the Chemical Formula 2 may include at least one of compounds represented by the following Chemical Formulae 2a to 2e.

[Chemical Formula 2a]

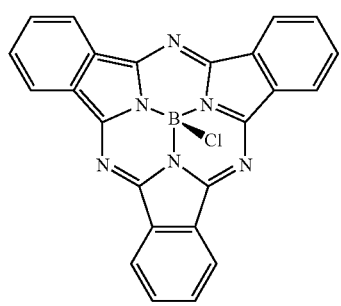

[Chemical Formula 2b]

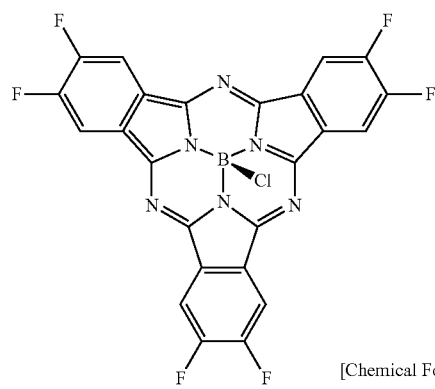

[Chemical Formula 2c]

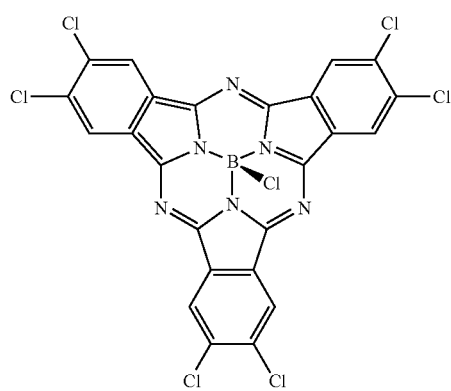

[Chemical Formula 2d]

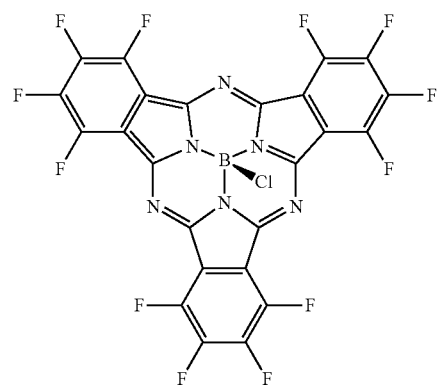

[Chemical Formula 2e]

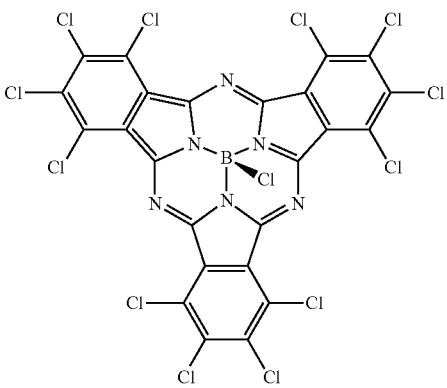

The compound represented by the Chemical Formula 3 is a compound having a functional group in a boron (B) axial direction, that is, an aryloxy group having at least one halogen atom in Z, and may increase light selectivity in a green wavelength region and improve thermal stability when used with a compound represented by the Chemical Formula 1 or the Chemical Formula 2.

The Z of the Chemical Formula 3 may be, for example, a phenoxy group having at least one fluorine atom, and may be, for example, represented by the following Chemical Formula A.

[Chemical Formula A]

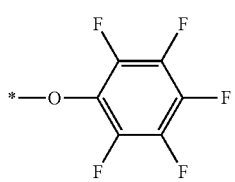

Each of the $R^m$ to $R^y$ of the Chemical Formula 3 may be hydrogen, or at least one thereof may include a halogen atom.

The compound represented by the Chemical Formula 3 may include at least one of compounds represented by the following Chemical Formula 3a or 3b.

[Chemical Formula 3a]

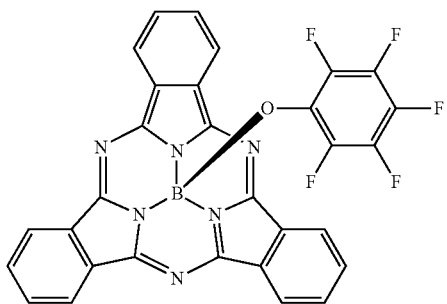

[Chemical Formula 3b]

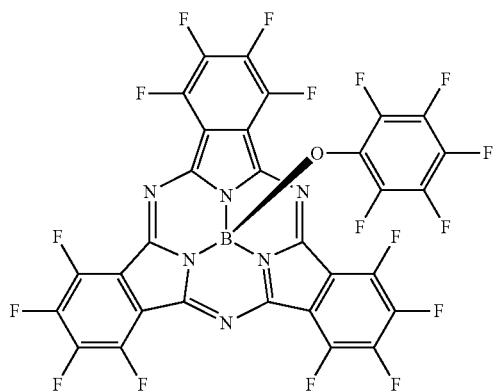

The compound represented by the Chemical Formula 1 or 2 may be a p-type semiconductor, and the compound represented by the Chemical Formula 3 may be an n-type semiconductor.

The compound represented by the Chemical Formula 1 or 2 and the compound represented by the Chemical Formula 3 may have a bandgap of about 1.5 eV to about 3.5 eV, respectively. Within the range, the compounds may have a bandgap of about 1.8 eV to 2.5 eV. When p-type and n-type semiconductor materials in an active layer respectively have a bandgap within the range, the active layer may absorb light in a green wavelength, for example, have a maximum absorption peak in a wavelength region ranging from about 500 nm to about 600 nm.

The compound represented by the Chemical Formula 1 or 2 and the compound represented by the Chemical Formula 3 have a LUMO energy level difference ranging from about 0.2 eV to about 1.5 eV. When the p-type and n-type semiconductors in an active layer have a LUMO energy level difference within the range, external quantum efficiency (EQE) may be improved and effectively adjusted depending on a bias applied thereto.

The active layer 30 may be a single layer or a multilayer. The active layer 30 may be, for example, an intrinsic layer (I layer), or various combinations of a p-type layer/n-type layer, a p-type layer/I layer, an I layer/n-type layer, and a p-type layer/I layer/n-type layer.

The intrinsic layer may include the compound represented by the Chemical Formula 1 or 2 and the compound represented by the Chemical Formula 3 at a ratio of about 1:100 to about 100:1. The compounds may be included in a ratio ranging from about 1:50 to about 50:1 within the range, for example, about 1:10 to about 10:1, or about 1:1. When the p-type and n-type semiconductors have a composition ratio within the range, an exciton may be effectively produced, and a pn junction may be effectively formed.

The p-type layer may include the compound represented by the Chemical Formula 1 or 2, and the n-type layer may include the compound represented by the Chemical Formula 3.

The active layer 30 may have a thickness ranging from about 1 nm to about 500 nm. The active layer 30 may have a thickness about 5 nm to about 300 nm within the range. When the active layer 30 has a thickness within the range, the active layer may effectively absorb light, effectively separate holes from electrons, and transfer them, effectively improving photoelectric conversion efficiency.

In the organic photoelectronic device 100, when light is incident from the first electrode (e.g., anode) 10 and/or second electrode (e.g., cathode) 20, and when the active layer 30 absorbs light having a predetermined or given wavelength region, excitons may be generated from the inside. The excitons are separated into holes and electrons at the active layer 30, and the separated holes are transferred to the first electrode (e.g., anode) 10 and the separated electrons are transferred to the second electrode (e.g., cathode) 20 so as to allow current to flow in the organic photoelectronic device.

The organic photoelectronic device 100 may include a light transmission auxiliary layer (not shown) at a light incident side thereof. For example, when the first electrode (e.g., anode) 10 is a light transmission electrode, the light transmission auxiliary layer may be positioned at one side of the first electrode (e.g., anode) 10, and when the second electrode (e.g., cathode) 20 is a light transmission electrode, the light transmission auxiliary layer may be positioned at one side of the second electrode (e.g., cathode) 20. The light transmission auxiliary layer is disposed at a light incident side of an organic photoelectronic device, and thus decreases reflectance of the incident light and may further increase light absorption.

The light transmission auxiliary layer may include, for example, a material having a refractive index ranging from about 1.6 to about 2.5, and for example, at least one selected from a metal oxide, a metal sulfide, and an organic material that have a refractive index within the range. The metal oxide may include, for example, tungsten oxide, zinc oxide, indium oxide, tin oxide, indium tin oxide (ITO), indium zinc oxide (IZO), aluminum oxide, aluminum tin oxide (ATO), fluorine doped tin oxide (FTO), molybdenum oxide, vanadium oxide, rhenium oxide, niobium oxide, tantalum oxide, titanium oxide, nickel oxide, copper oxide, cobalt oxide, manganese oxide, chromium oxide, or a combination thereof, the metal sulfide may include, for example zinc sulfide (ZnS), and the organic material may include, for example, an amine derivative.

Figure 2:
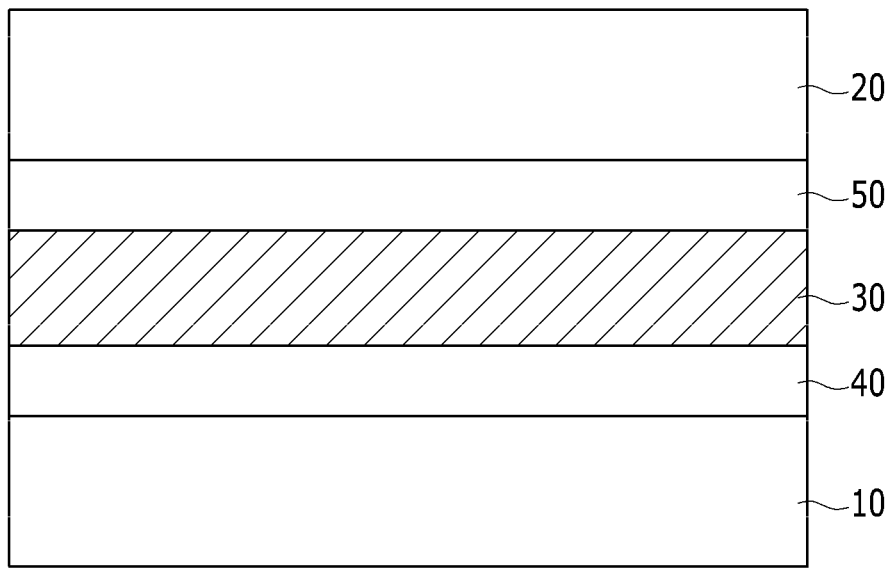
FIG. 2 is a cross-sectional view showing an organic photoelectronic device according to example embodiments.

Referring to FIG. 2, an organic photoelectronic device according to example embodiments is described. FIG. 2 is a cross-sectional view showing an organic photoelectronic device according to example embodiments.

Referring to FIG. 2, an organic photoelectronic device 100 according to example embodiments includes an first electrode (e.g., anode) 10, a second electrode (e.g., cathode) 20, and an active layer 30 interposed between the first electrode (e.g., anode) 10 and the second electrode (e.g., cathode) 20.

However, the organic photoelectronic device 100 according to example embodiments further includes first and second charge auxiliary layers 40 and 50 respectively between the first electrode (e.g., anode) 10 and the active layer 30 and between the second electrode (e.g., cathode) 20 and the active layer 30. The first and second charge auxiliary layers 40 and 50 may further facilitate the transportation of holes and electrons separated from the active layer 30, so as to increase efficiency.

The first charge auxiliary layer 40 may be at least one selected from a hole injection layer (HIL) for facilitating hole injection, a hole transport layer (HTL) for facilitating hole transport, and an electron blocking layer (EBL) for preventing or inhibiting electron transport. The second charge auxiliary layer 50 may be at least one selected from an electron injection layer (EIL) for facilitating electron injection, an electron transport layer (ETL) for facilitating electron transport, and a hole blocking layer (HBL) for preventing or inhibiting hole transport.

The hole transport layer (HTL) may include one selected from, for example, poly(3,4-ethylenedioxythiophene):poly (styrenesulfonate) (PEDOT:PSS), polyarylamine, poly(N-vinylcarbazole), polyaniline, polypyrrole, N,N,N',N'-tetrakis (4-methoxyphenyl)-benzidine (TPD), 4-bis[N-(1-naphthyl)-N-phenyl-amino]biphenyl (α-NPD), m-MTDATA, 4,4',4"-tris(N-carbazolyl)-triphenylamine (TCTA), and a combination thereof, but is not limited thereto.

The electron blocking layer (EBL) may include one selected from, for example, poly(3,4-ethylenedioxythiophene):poly(styrenesulfonate) (PEDOT:PSS), polyarylamine, poly(N-vinylcarbazole), polyaniline, polypyrrole, N,N,N',N'-tetrakis(4-methoxyphenyl)-benzidine (TPD), 4-bis[N-(1-naphthyl)-N-phenyl-amino]biphenyl (α-NPD), m-MTDATA, 4,4',4"-tris(N-carbazolyl)-triphenylamine (TCTA), and a combination thereof, but is not limited thereto.

The electron transport layer (ETL) may include one selected from, for example, 1,4,5,8-naphthalene-tetracarboxylic dianhydride (NTCDA), bathocuproine (BCP), LiF, $Alq_3$, $Gaq_3$, $Inq_3$, $Znq_2$, $Zn(BTZ)_2$, $BeBq_2$, and a combination thereof, but is not limited thereto.

The hole blocking layer (HBL) may include one selected from, for example, 1,4,5,8-naphthalene-tetracarboxylic dianhydride (NTCDA), bathocuproine (BCP), LiF, $Alq_3$, $Gaq_3$, $Inq_3$, $Znq_2$, $Zn(BTZ)_2$, $BeBq_2$, and a combination thereof, but is not limited thereto.

Either one of the first and second charge auxiliary layers 40 and 50 may be omitted.

The organic photoelectronic device may be applied to various fields, for example a solar cell, an image sensor, a photo-detector, a photo-sensor, and an organic light emitting diode (OLED), but is not limited thereto.

Hereinafter, an example of an image sensor including the organic photoelectronic device is described referring to drawings. As an example of an image sensor, an organic CMOS image sensor is described.

Figure 3:
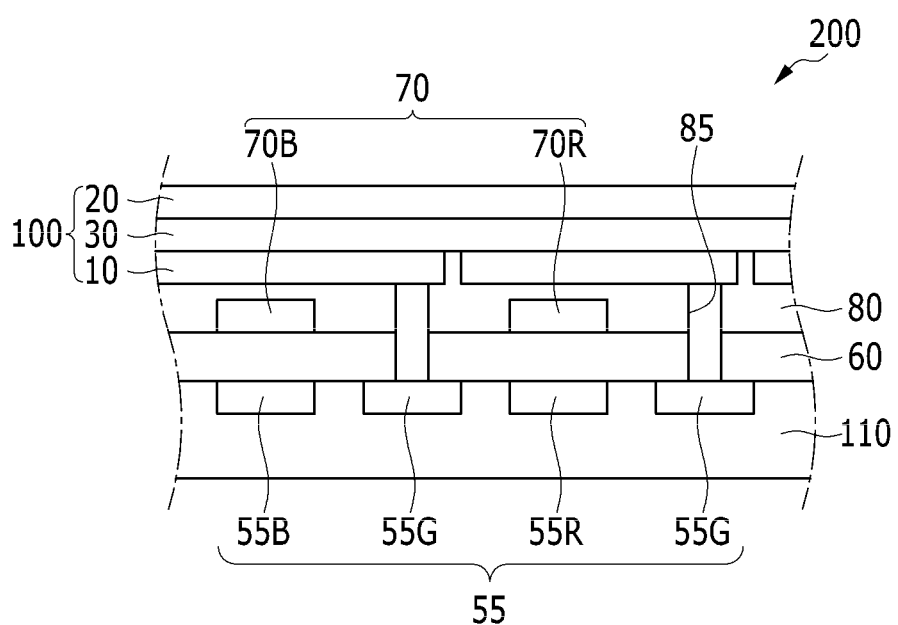
FIG. 3 is a cross-sectional view showing an organic CMOS image sensor according to example embodiments.
Figure 4:
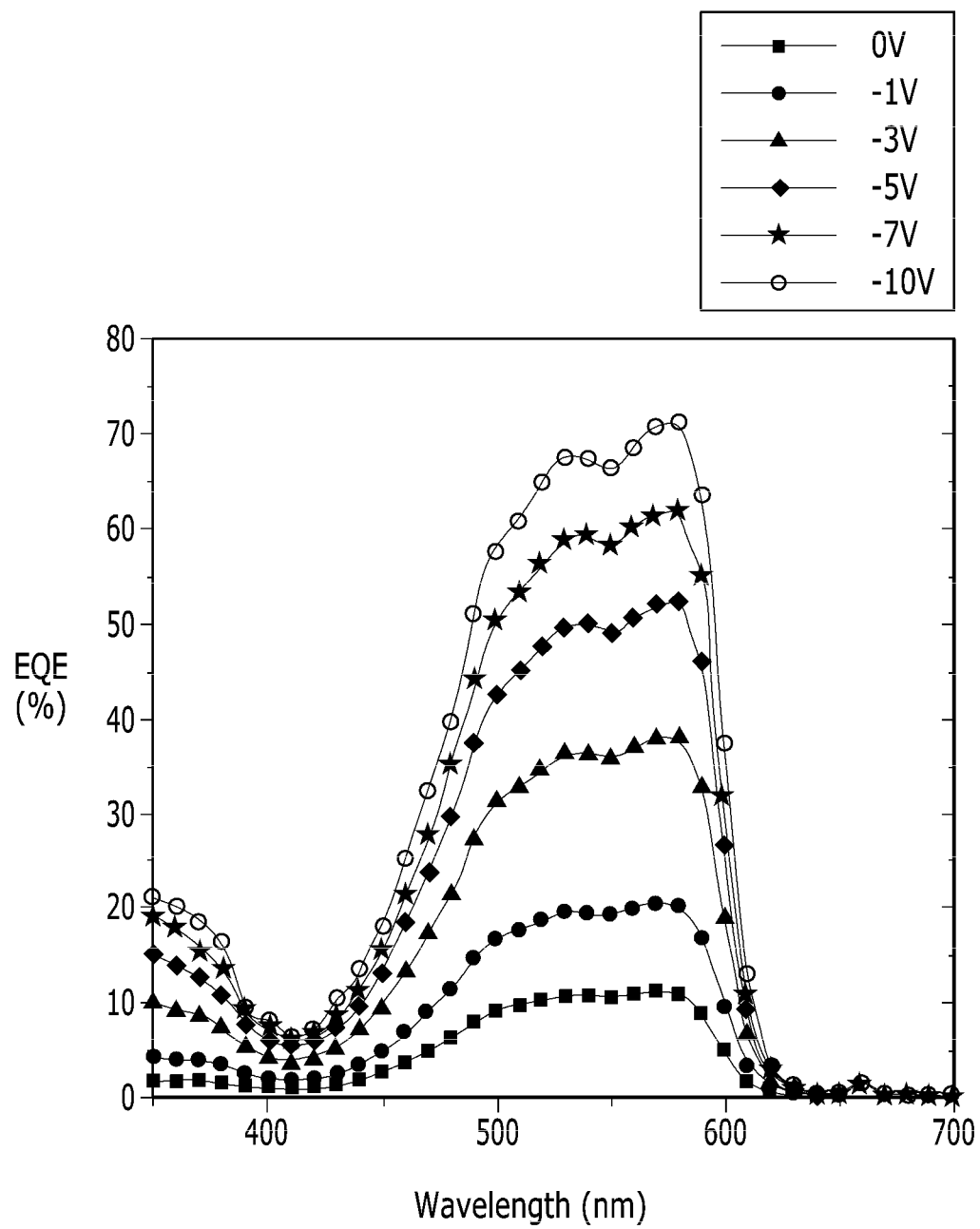
FIGS. 4 to 7 are graphs showing external quantum efficiency depending on a wavelength of the organic photoelectronic devices according to Examples 1 to 4.
Figure 5:
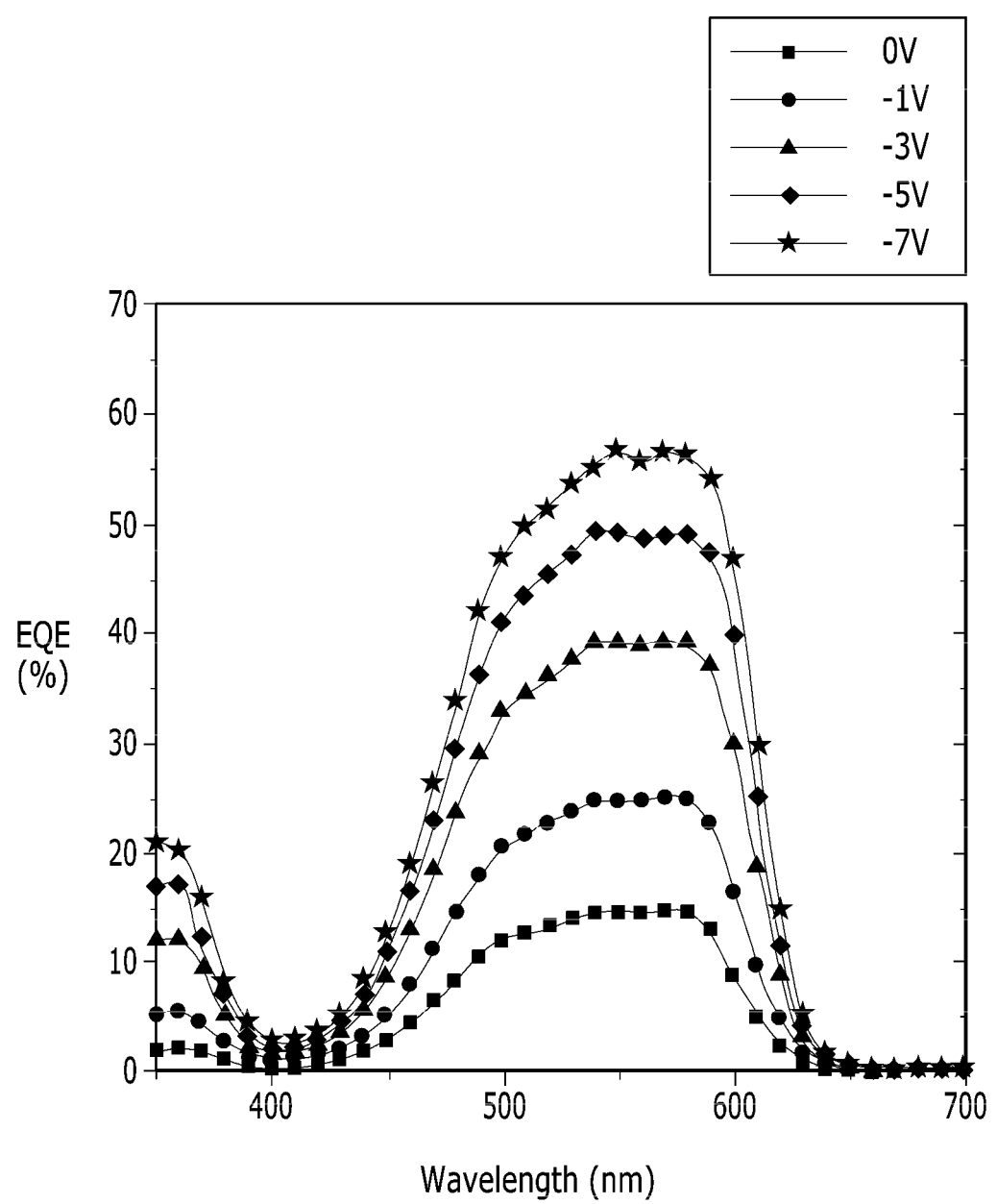
Figure 6:
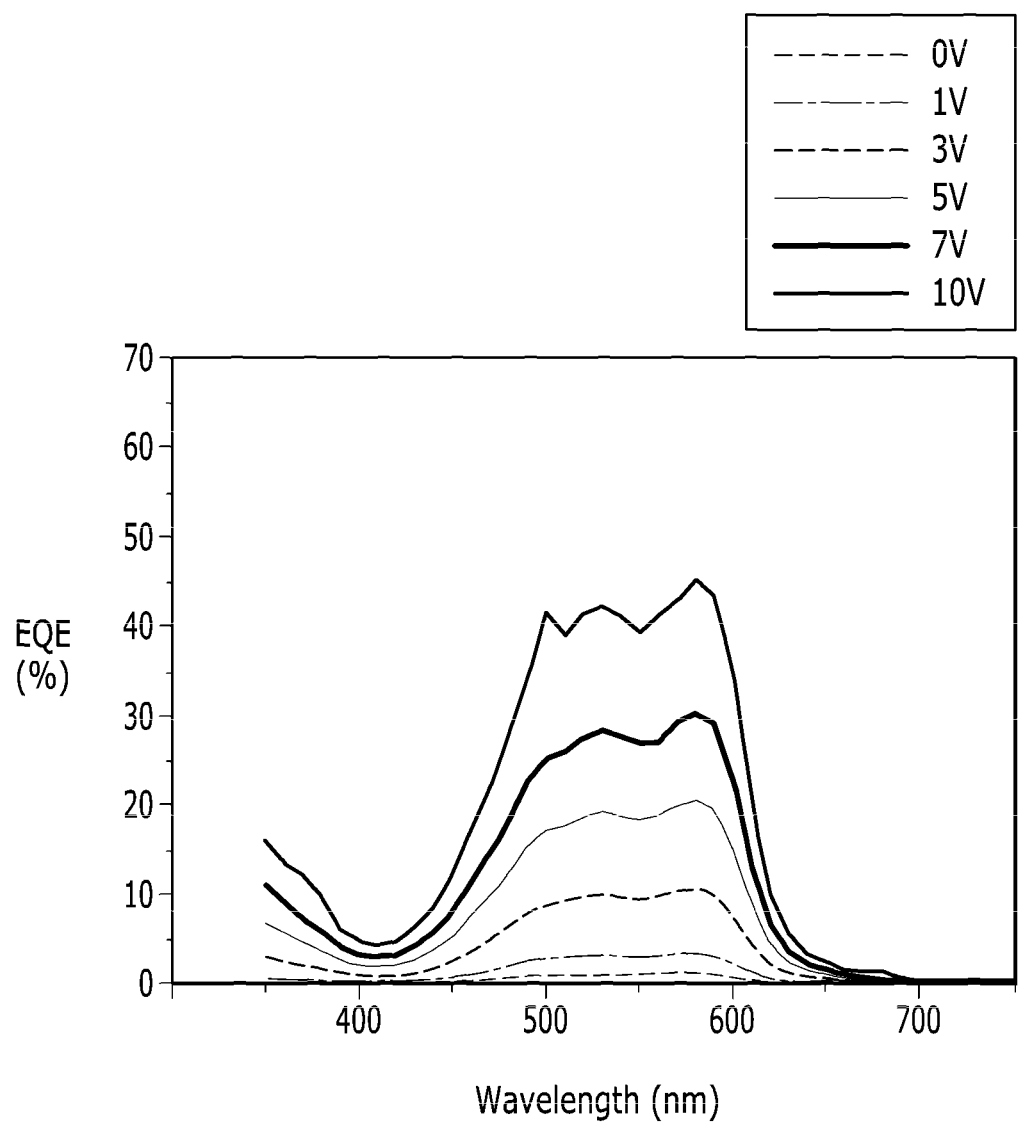
Figure 7:
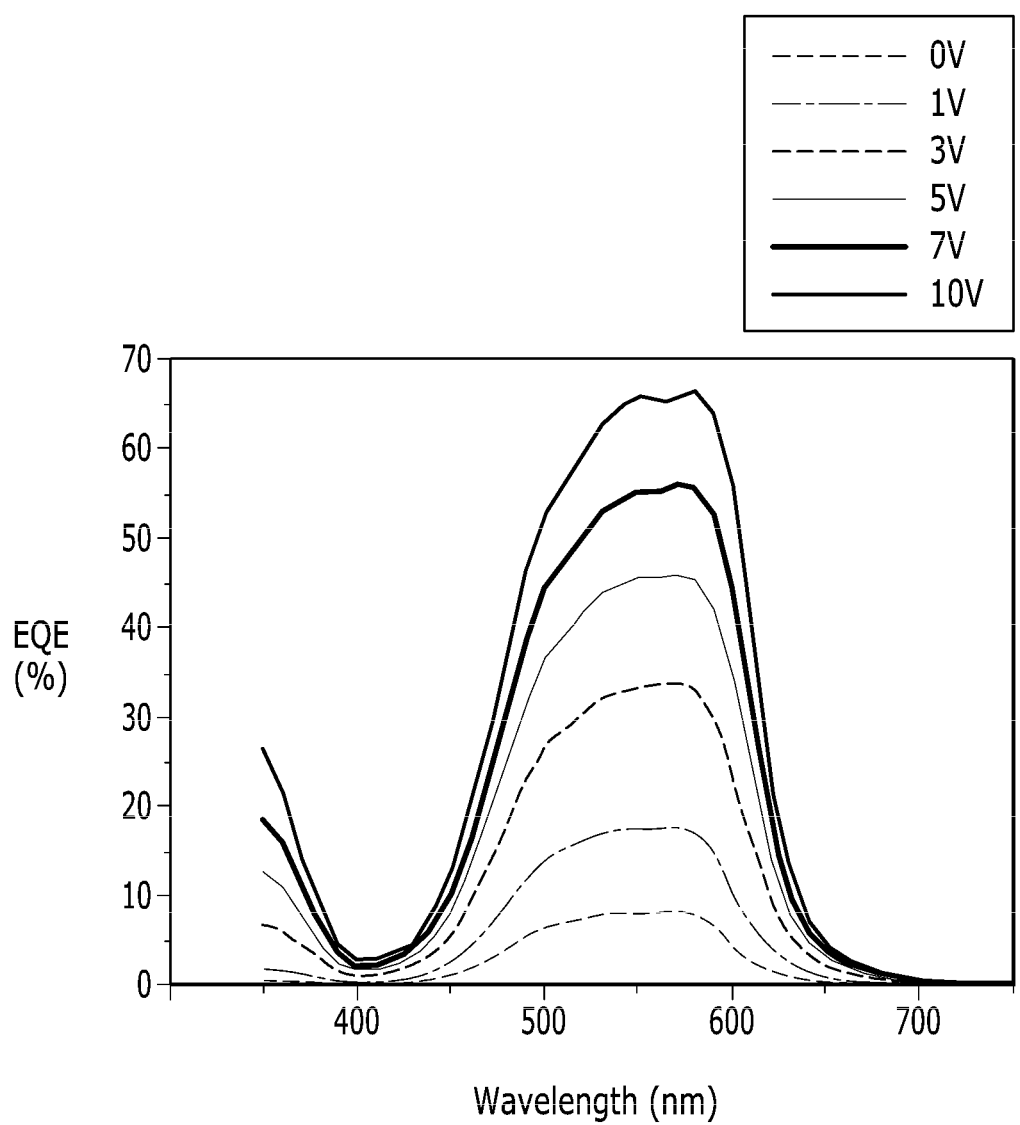

FIG. 3 is a cross-sectional view showing an organic CMOS image sensor according to example embodiments. FIG. 3 illustrates adjacent blue, green, and red pixels, but is not limited thereto. Hereinafter, a constituent element including "B" in the reference symbol refers to a constituent element included in the blue pixel, a constituent element including "G" refers to a constituent element included in the green pixel, and a constituent element including "R" in the reference symbol refers to a constituent element included in the red pixel.

Referring to FIG. 3, an organic CMOS image sensor 200 includes a semiconductor substrate 110 integrated with a photo-sensing device 55 and a transmission transistor (not shown), a lower insulation layer 60, color filters 70, an upper insulation layer 80, and an organic photoelectronic device 100.

The semiconductor substrate 110 may be a silicon substrate, and is integrated with the photo-sensing device 55 and the transmission transistor (not shown). The photo-sensing device 55 may be a photodiode. The photo-sensing device 55 and the transmission transistor may be integrated in each pixel, and as shown in the drawing, the photo-sensing device 55 includes a blue pixel photo-sensing device 55B, at least one green pixel photo-sensing device 55G, and a red pixel photo-sensing device 55R. The photo-sensing device 55 senses light, and the information sensed by the photo-sensing device 55 is transferred by the transmission transistor.

Metal wires (not shown) and pads (not shown) are formed on the semiconductor substrate 110. In order to decrease signal delay, the metal wires and pads may be made of a metal having relatively low resistivity, for example, aluminum (Al), copper (Cu), silver (Ag), and alloys thereof, but is not limited thereto.

The lower insulation layer 60 is formed on the metal wires and pads. The lower insulation layer 60 may be made of an inorganic insulating material, e.g., silicon oxide and/or silicon nitride, or a low dielectric constant (low K) material, e.g., SiC, SiCOH, SiCO, and SiOF.

The lower insulation layer 60 has a trench (not shown) exposing each photo-sensing device 55B, 55G, and 55R of each pixel. The trench may be filled with fillers.

A color filter 70 is formed on the lower insulation layer 60. The color filter 70 includes the blue filter 70B formed in the blue pixel and the red filter 70R filled in the red pixel. In example embodiments, a green filter is not included, but a green filter may be further included.

The upper insulation layer 80 is formed on the color filter 70. The upper insulation layer 80 may eliminate a step caused by the color filters 70 and smooth the surface. The upper insulation layer 80 and lower insulation layer 60 may include a contact hole (not shown) exposing a pad and a through hole 85 exposing the photo-sensing device 500 of a green pixel.

The organic photoelectronic device 100 is formed on the upper insulation layer 80. The organic photoelectronic device 100 includes an first electrode (e.g., anode) 10, an active layer 30, and a second electrode (e.g., cathode) 20 as described. However, the positions of the first electrode (e.g., anode) 10 and second electrode (e.g., cathode) 20 may be exchanged with each other. For better understanding and ease of description, the organic photoelectronic device 100 according to example embodiments is shown, but it is not limited thereto, and all organic photoelectronic devices 100 according to example embodiments may be applicable.

Both of the first electrode (e.g., anode) 10 and the second electrode (e.g., cathode) 20 may be light-transmission electrodes. The active layer 30 includes a p-type semiconductor represented by Chemical Formula 1 or 2 and an n-type semiconductor represented by Chemical Formula 3 and selectively absorbs light in a green wavelength region as aforementioned, and may replace a color filter of green pixels.

When light enters from the second electrode (e.g., cathode) 20, the light in a green wavelength region may be mainly absorbed in the active layer 30 and photoelectrically converted, while the light in the rest of the wavelength regions passes through the first electrode (e.g., anode) 10 and may be sensed in a photo-sensing device 50.

Hereinafter, the present disclosure is illustrated in more detail with reference to examples. However, these examples are exemplary, and the present disclosure is not limited thereto.

Manufacture of Organic Photoelectronic Device—1

Example 1

An ITO is sputtered on a glass substrate to form an about 100 nm-thick anode, and a molybdenum oxide ($MoO_x$) is deposited thereon to form a 30 nm-thick molybdenum oxide ($MoO_x$) thin film as a charge auxiliary layer. Subsequently, a compound represented by the following Chemical Formula 1aa (HOMO 5.5 eV, LUMO 3.2 eV, and bandgap 2.3 eV) as a p-type semiconductor and a compound the following Chemical Formula 3a (HOMO 5.9 eV, LUMO 3.8 eV, and bandgap 2.1 eV) as a n-type semiconductor are co-deposited in a ratio of 1:1 on the molybdenum oxide ($MoO_x$) thin film to form a 90 nm-thick active layer. Subsequently, aluminum (Al) is sputtered on the active layer to form an 80 nm-thick cathode, manufacturing an organic photoelectronic device.

[Chemical Formula 1aa]

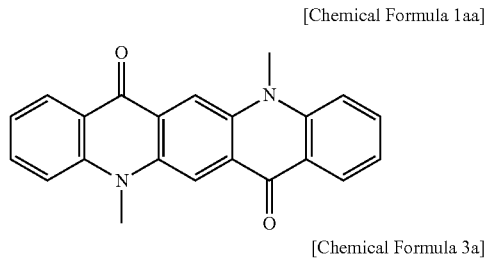

[Chemical Formula 3a]

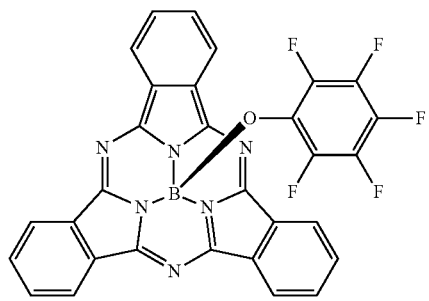

Example 2

An organic photoelectronic device is manufactured according to the same method as Example 1, except for using the compound represented by the following Chemical Formula 3b (HOMO 6.7 eV, LUMO 4.6 eV, and bandgap 2.1 eV) instead of the compound represented by the Chemical Formula 3a as an n-type semiconductor.

[Chemical Formula 3b]

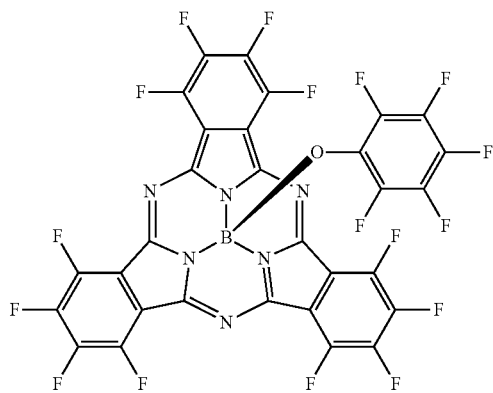

Example 3

An organic photoelectronic device is manufactured according to the same method as Example 1, except for using a compound represented by the following Chemical Formula 2a (HOMO 5.6 eV, LUMO 3.6 eV, and bandgap 2.0 eV) instead of the compound represented by the Chemical Formula 1aa as a p-type semiconductor.

[Chemical Formula 2a]

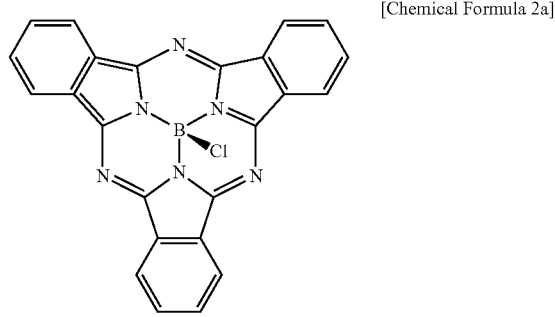

Example 4

An organic photoelectronic device is manufactured according to the same method as Example 1, except for using a compound represented by the Chemical Formula 2a instead of the compound represented by the Chemical Formula 1aa as a p-type semiconductor and a compound represented by the Chemical Formula 3b instead of the compound represented by the Chemical Formula 3a as a n-type semiconductor.

Evaluation 1

External quantum efficiency depending on a wavelength (EQE) of the organic photoelectronic devices according to Examples 1 to 4 is evaluated.

The external quantum efficiency is measured by using an IPCE measurement system (McScience Inc., Korea). First of all, the IPCE measurement system is calibrated by using a Si photo diode (Hamamatsu Photonics K.K., Japan) and equipped on the organic photoelectronic devices according to Examples 1 to 4, and external quantum efficiency of the organic photoelectronic devices are measured in a wavelength region ranging from about 350 nm to 700 nm.

FIGS. 4 to 7 are graphs showing external quantum efficiency depending on a wavelength of the organic photoelectronic devices according to Examples 1 to 4.

Referring to FIGS. 4 to 7, the organic photoelectronic devices according to Examples 1 to 4 show a maximum peak of external quantum efficiency (EQE) in a green wavelength region ranging from about 500 nm to 600 nm.

Evaluation 2

Thermal stability of the organic photoelectronic device according to Example 1 is measured.

The thermal stability is evaluated by measuring current characteristics and external quantum efficiency (EQE) of the organic photoelectronic device according to Example 1 after the organic photoelectronic device is allowed to stand at 100° C. for 30 minutes, at 140° C. for 10 minutes, and at 140° C. for 30 minutes.

Figure 8:
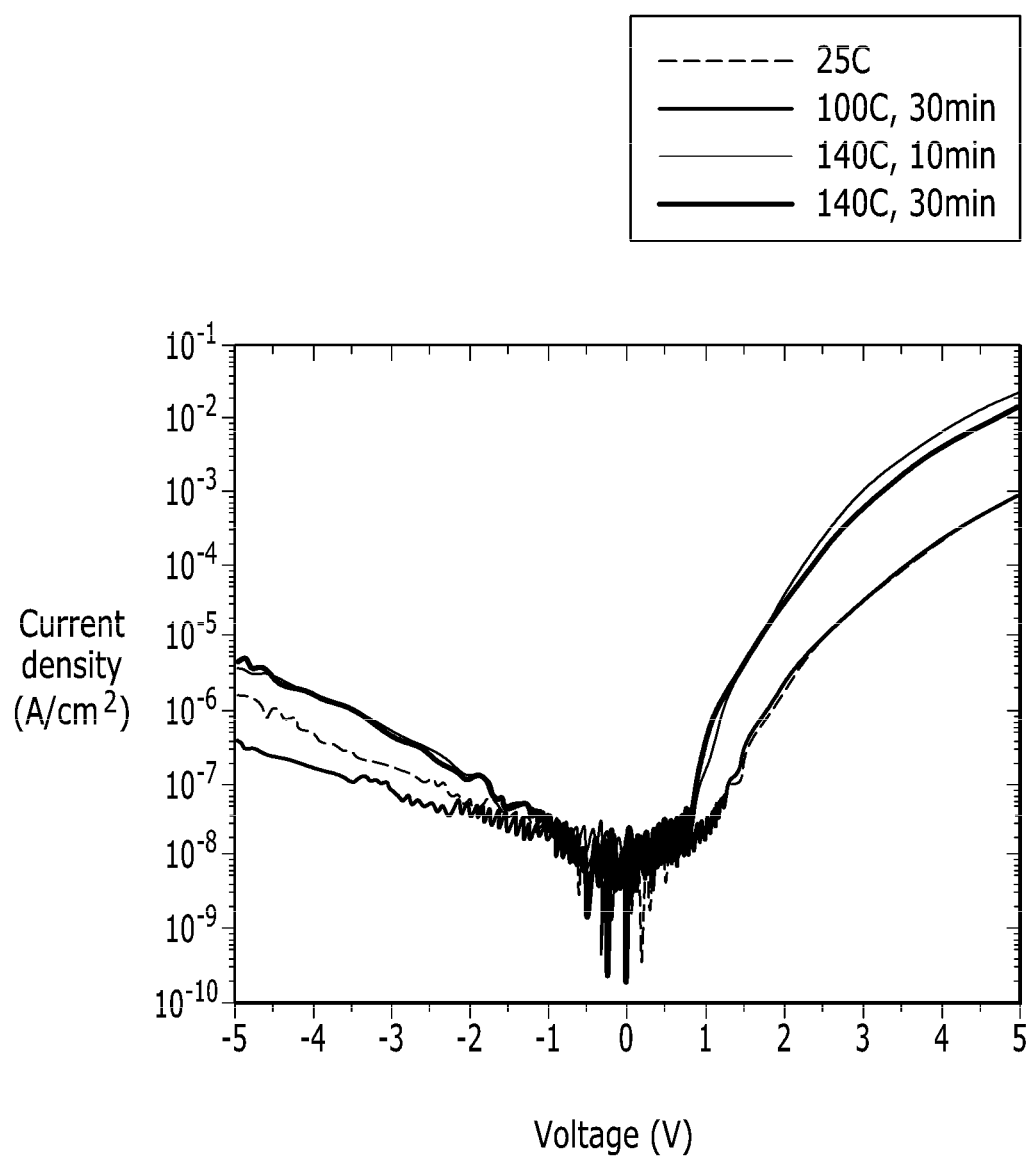
FIGS. 8 and 9 are graphs showing thermal stability of the organic photoelectronic device of Example 1, respectively.
Figure 9:
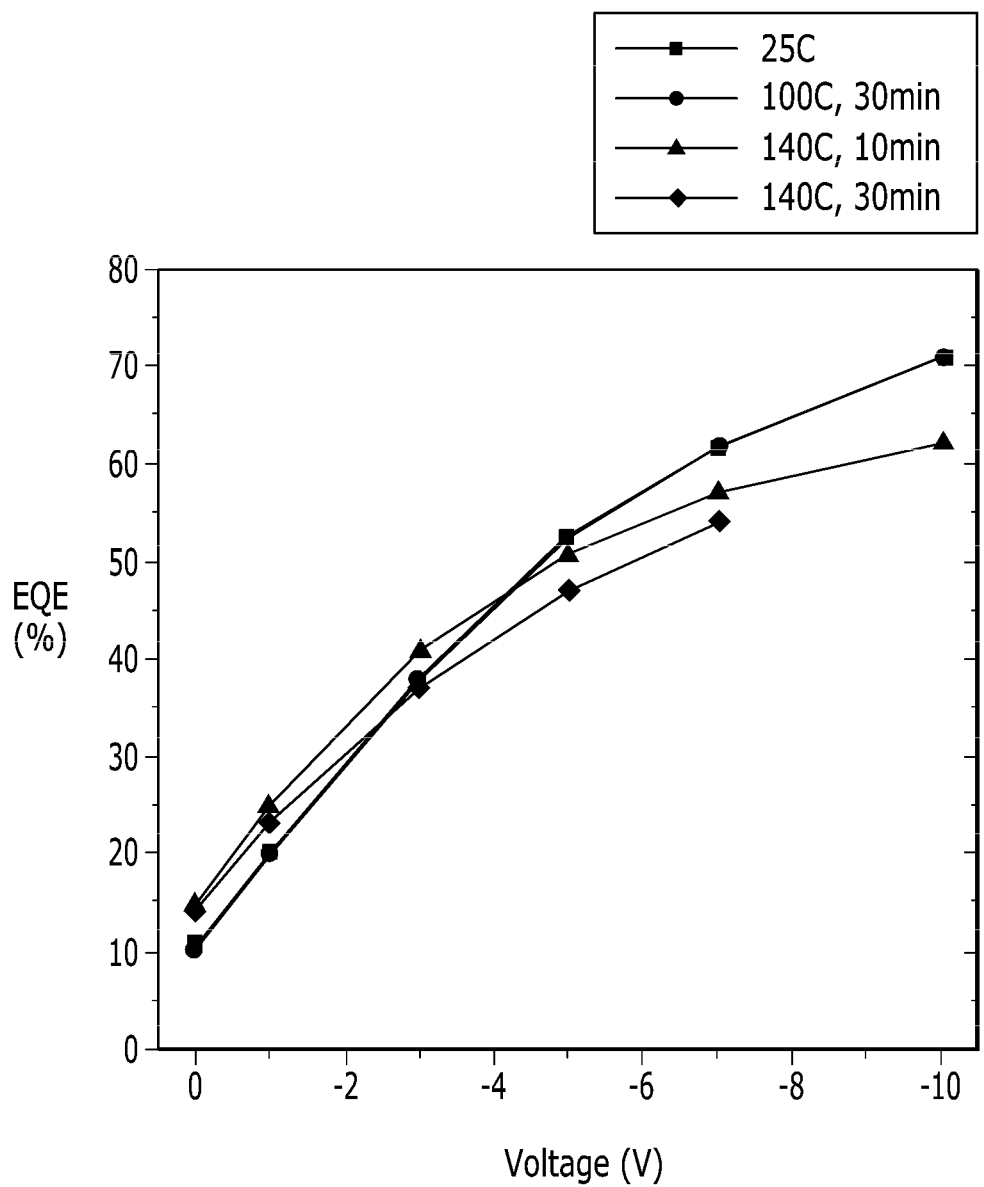

FIGS. 8 and 9 are graphs showing thermal stability of the organic photoelectronic device of Example 1, respectively.

Referring to FIG. 8, the organic photoelectronic device according to Example 1 shows similar current characteristics or rather increased forward current density after being allowed to stand at 100° C. for 30 minutes, at 140° C. for 10 minutes, and at 140° C. for 30 minutes.

Referring to FIG. 9, the organic photoelectronic device according to Example 1 almost maintains the same external quantum efficiency (EQE) after being allowed to stand at 100° C. for 30 minutes, at 140° C. for 10 minutes, and at 140° C. for 30 minutes.

Figure 10:
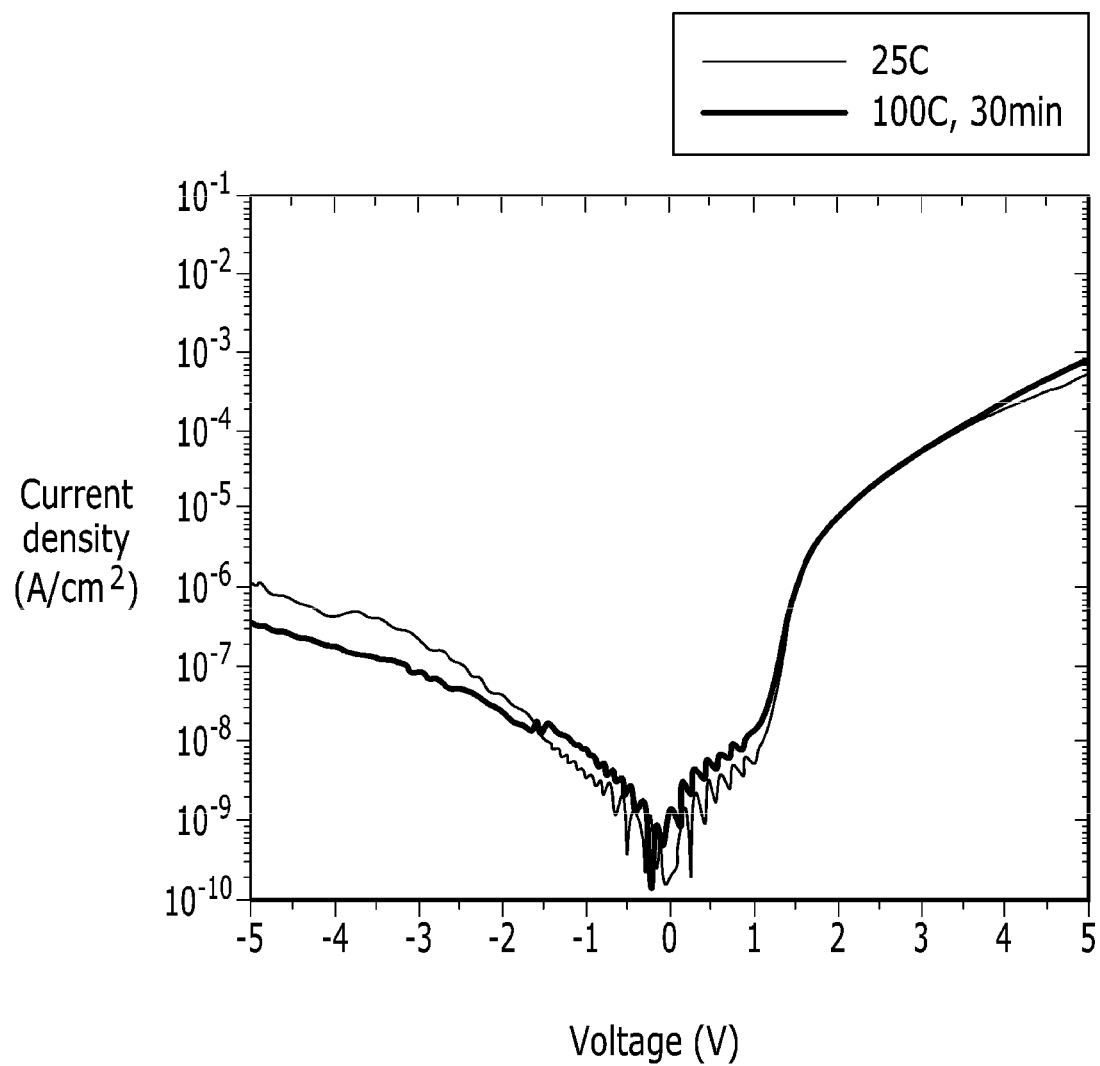
FIGS. 10 and 11 are graphs showing thermal stability of the organic photoelectronic device of Example 3, respectively.
Figure 11:
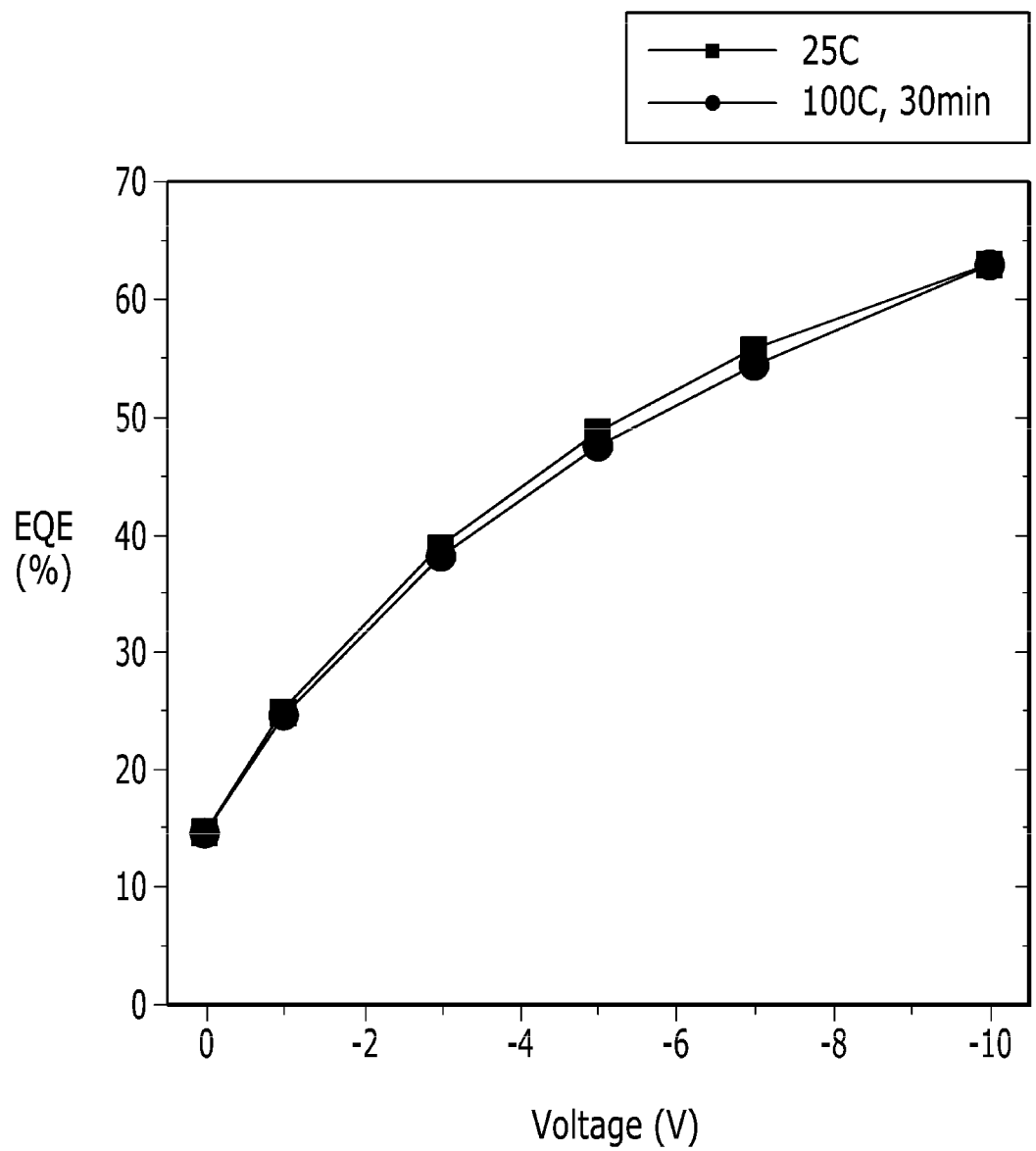

FIGS. 10 and 11 are graphs showing thermal stability of the organic photoelectronic device of Example 3, respectively.

Referring to FIG. 10, the organic photoelectronic device according to Example 3 shows no current characteristic changes after being allowed to stand at 100° C. for 30 minutes.

Referring to FIG. 11, the organic photoelectronic device according to Example 3 maintains almost the same external quantum efficiency (EQE) after being allowed to stand at 100° C. for 30 minutes.

From the results, the organic photoelectronic device may secure thermal stability at a relatively high temperature, and particularly at a temperature which is a process temperature of an organic photoelectronic device and/or at a process temperature of an image sensor including the organic photoelectronic device.

Manufacture of Organic Photoelectronic Device—2

Example 5

The organic photoelectronic device according to Example 5 includes a transparent electrode for both anode and cathode, unlike those of the above-described examples, and has an inverted structure. Specifically, the organic photoelectronic device according to Example 5 is manufactured as follows.

An ITO is sputtered on a glass substrate to form a 100 nm-thick lower electrode. Subsequently, a molybdenum oxide (MoO$_x$, 0<x≤3) and aluminum (Al) are thermally deposited in a ratio of 1:1 (wt/wt) on the lower electrode to form a 5 nm-thick lower charge auxiliary layer.

Subsequently, a compound represented by the above Chemical Formula 1aa as a p-type semiconductor and a compound represented by the above Chemical Formula 3a as an n-type semiconductor are co-deposited in a ratio of 1:1 on the lower charge auxiliary layer to form a 110 nm-thick active layer. Subsequently, a molybdenum oxide (MoO$_x$, 0<x≤3) is thermally deposited on the active layer to form a 20 nm upper charge auxiliary layer. Subsequently, silver (Ag) doped with 10% of molybdenum oxide (MoO$_x$, 0<x≤3) is thermally deposited on the upper charge auxiliary layer to form a 12 nm-thick upper electrode. Subsequently, tungsten oxide (WO$_x$, 0<x≤3) is deposited on the upper electrode to form a 30 nm-thick light transmission auxiliary layer, manufacturing an organic photoelectronic device.

Evaluation 3

External quantum efficiency (EQE) depending on a wavelength of the organic photoelectronic device according to Example 5 is evaluated.

Figure 12:
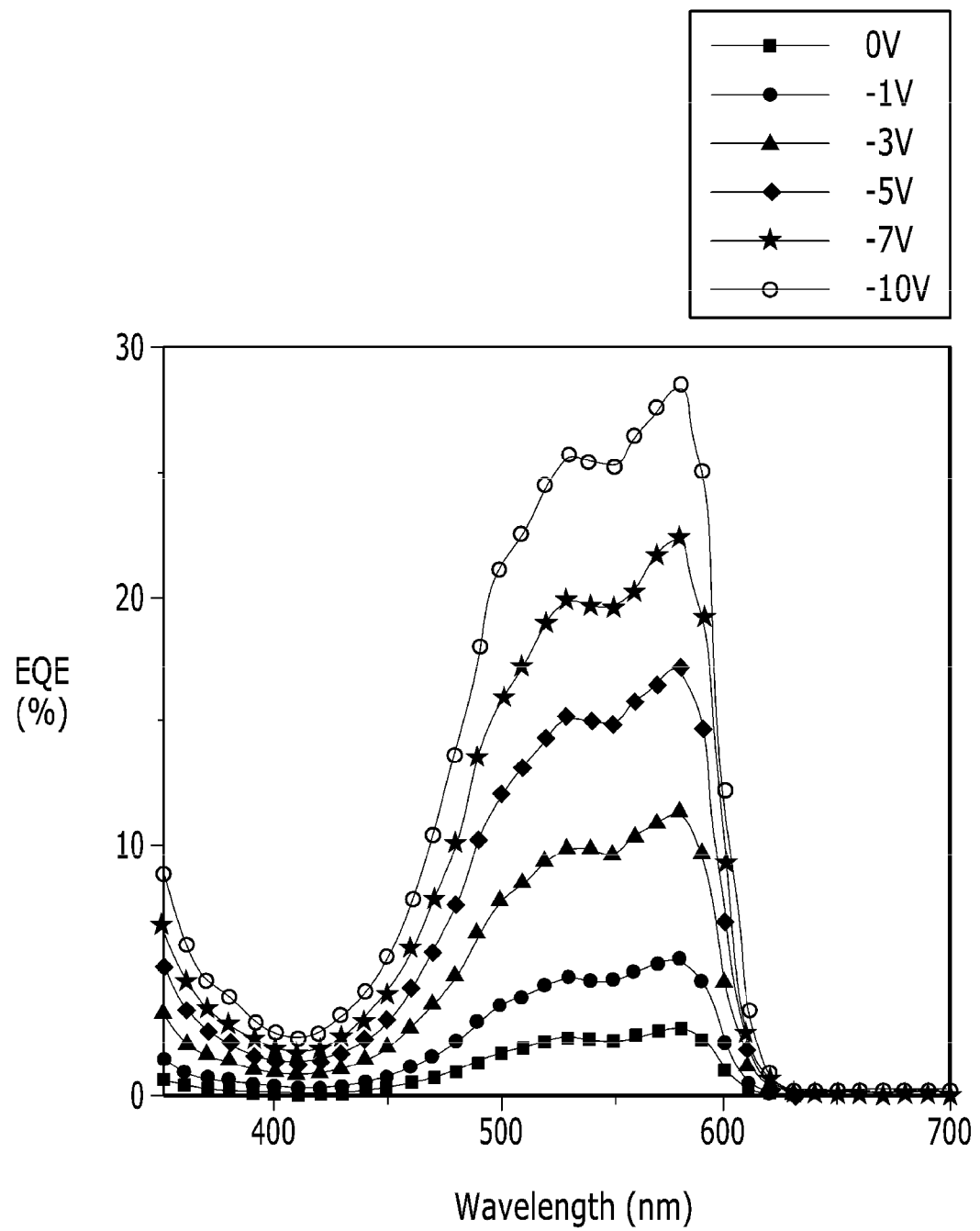
FIG. 12 is a graph showing external quantum efficiency depending on a wavelength of the organic photoelectronic device according to Example 5.

FIG. 12 is a graph showing external quantum efficiency depending on a wavelength of the organic photoelectronic device according to Example 5.

Referring to FIG. 12, the organic photoelectronic device according to Example 5 shows a maximum peak of external quantum efficiency (EQE) in a green wavelength region ranging from about 500 nm to 600 nm.

Evaluation 4

Thermal stability of the organic photoelectronic device according to Example 5 is evaluated.

The thermal stability is evaluated by allowing the organic photoelectronic devices according to Example 5 to respectively stand at 100° C. for 30 minutes and at 140° C. for 30 minutes and then examining current characteristics and external quantum efficiency (EQE) changes.

Figure 13:
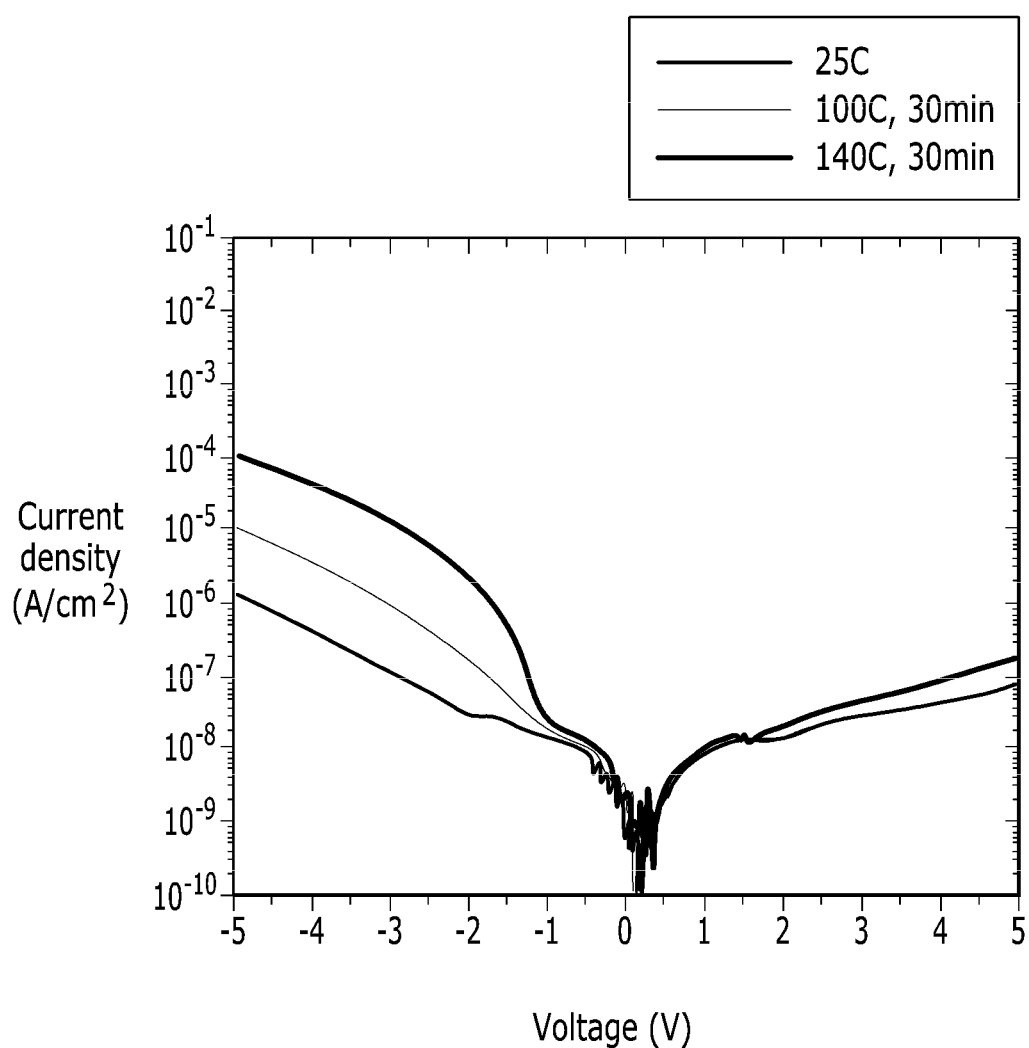
FIGS. 13 to 15 are graphs showing thermal stability of the organic photoelectronic device of Example 5, respectively.
Figure 14:
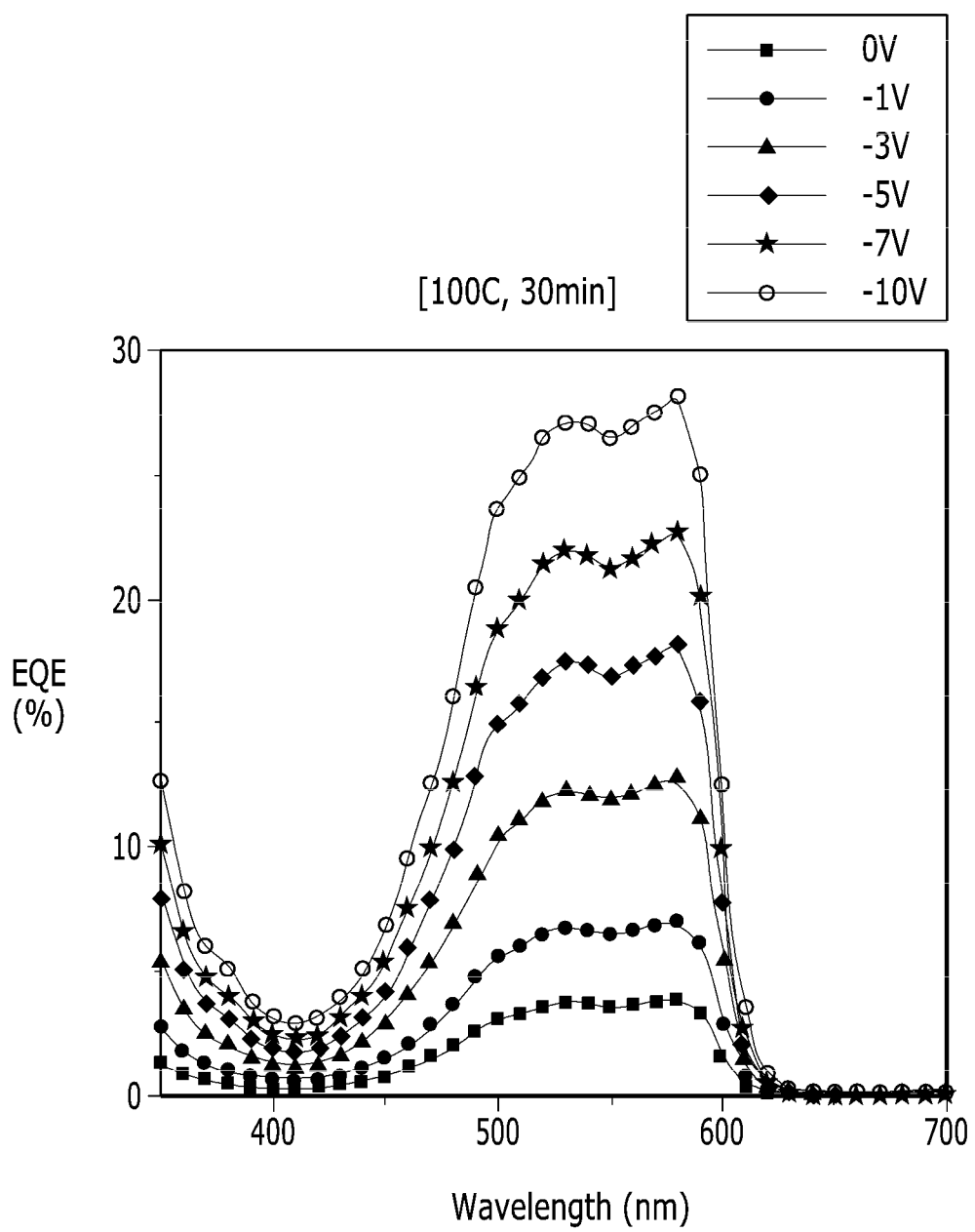
Figure 15:
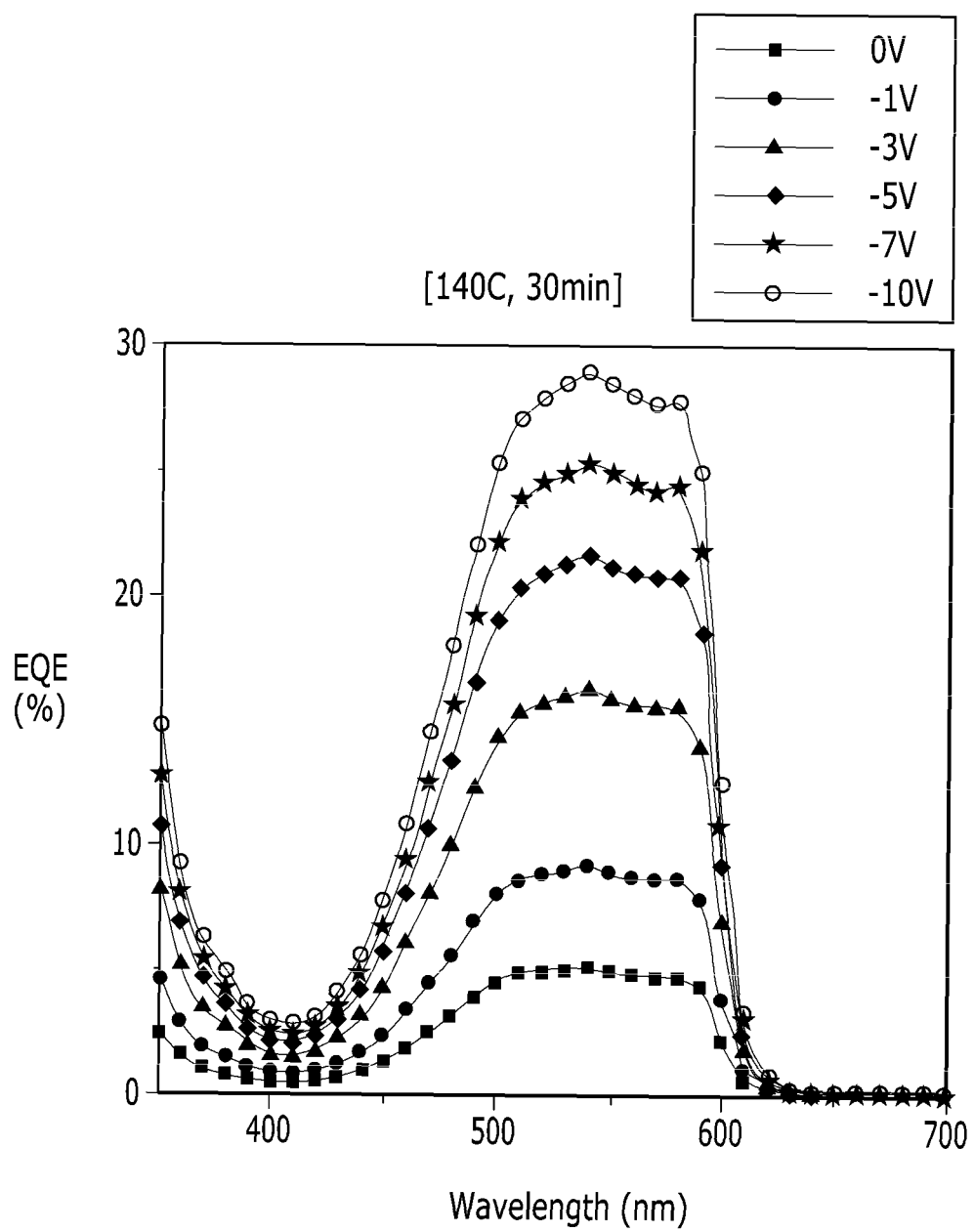

FIGS. 13 to 15 are graphs showing thermal stability of the organic photoelectronic device of Example 5, respectively.

Referring to FIG. 13, the organic photoelectronic device according to Example 5 shows an increase of forward current density characteristics after respectively being allowed to stand at 100° C. for 30 minutes and at 140° C. for 30 minutes.

Referring to FIGS. 14 and 15, the organic photoelectronic device according to Example 5 almost maintains external quantum efficiency (EQE) at the maximum peak after being allowed to stand at 100° C. for 30 minutes and at 140° C. for 30 minutes, compared with FIG. 12.

Accordingly, thermal stability is secured at the temperature including a relatively high temperature, and particularly, at a process temperature for an organic photoelectronic device and a process temperature for an image sensor.

While this disclosure has been described in connection with what is presently considered to be practical exemplary embodiments, it is to be understood that the inventive concepts are not limited to the disclosed embodiments, but, on the contrary, is intended to cover various modifications and equivalent arrangements included within the spirit and scope of the appended claims.

What is claimed is:

1. An organic photoelectronic device, comprising:
   a first electrode and a second electrode facing each other; and
   an active layer between the first electrode and the second electrode, the active layer including,
      a compound represented by the following Chemical Formula 1, and
      a compound represented by the following Chemical Formula 3:

[Chemical Formula 1]

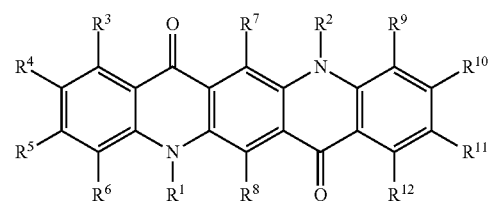

wherein, in the Chemical Formula 1,
   each of the $R^1$ and $R^2$ are independently one of hydrogen, a substituted or unsubstituted $C_1$ to $C_{30}$ alkyl group, a substituted or unsubstituted $C_6$ or $C_{30}$ aryl group, a substituted or unsubstituted $C_3$ to $C_{30}$ heteroaryl group, a substituted or unsubstituted $C_1$ to $C_{30}$ alkoxy group, and a combination thereof, and
   each of $R^3$ to $R^{12}$ are independently one of hydrogen, a substituted or unsubstituted $C_1$ to $C_{30}$ alkyl group, a substituted or unsubstituted $C_6$ to $C_{30}$ aryl group, a substituted or unsubstituted $C_3$ to $C_{30}$ heteroaryl group, a substituted or unsubstituted $C_1$ to $C_{30}$ alkoxy group, a halogen atom, a halogen-containing group, and a combination thereof,

[Chemical Formula 3]

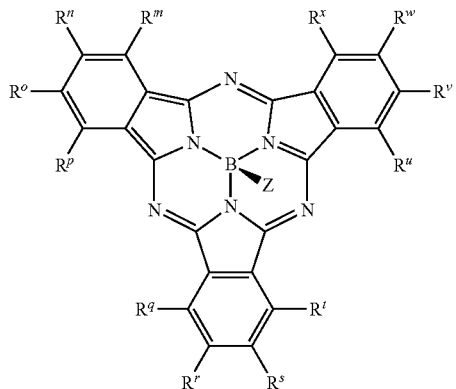

wherein, in the Chemical Formula 3,
each of $R^m$ to $R^y$ are independently one of hydrogen, a substituted or unsubstituted $C_1$ to $C_{30}$ alkyl group, a substituted or unsubstituted $C_6$ to $C_{30}$ aryl group, a substituted or unsubstituted $C_3$ to $C_{30}$ heteroaryl group, a halogen atom, a halogen-containing group, and a combination thereof, and
Z is a $C_6$ to $C_{20}$ aryloxy group having at least one halogen atom, wherein the compound represented by Chemical Formula 1 is a p-type semiconductor,
the compound represented by Chemical Formula 3 is an n-type semiconductor, and
the p-type semiconductor and the n-type semiconductor form a pn junction.

2. The organic photoelectronic device of claim 1, wherein the Z of the Chemical Formula 3 is a phenoxy group having at least one fluorine atom.

3. The organic photoelectronic device of claim 2, wherein the Z of the Chemical Formula 3 is represented by the following Chemical Formula A:

[Chemical Formula A]

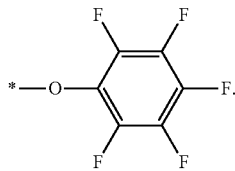

4. The organic photoelectronic device of claim 1, wherein each of the $R^m$ to $R^y$ of the Chemical Formula 3 are independently hydrogen or at least one thereof includes a halogen atom.

5. The organic photoelectronic device of claim 1, wherein the compound represented by Chemical Formula 3 includes at least one selected from compounds represented by the following Chemical Formula 3a or Chemical Formula 3b:

[Chemical Formula 3a]

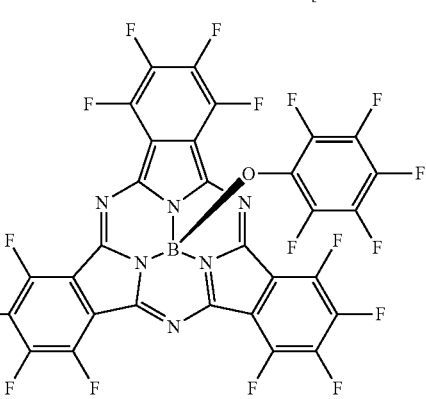

[Chemical Formula 3b]

6. The organic photoelectronic device of claim 1, wherein the compound represented by the Chemical Formula 1 includes at least one selected from compounds represented by the following Chemical Formulae 1a to 1e:

[Chemical Formula 1a]

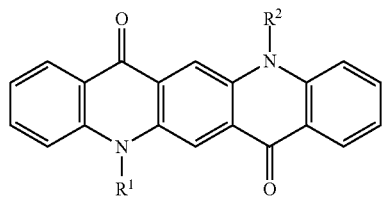

[Chemical Formula 1b]

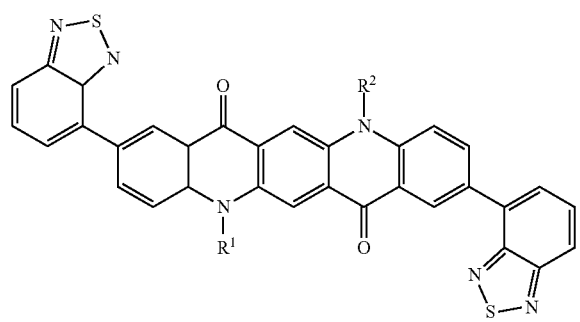

[Chemical Formula 1c]

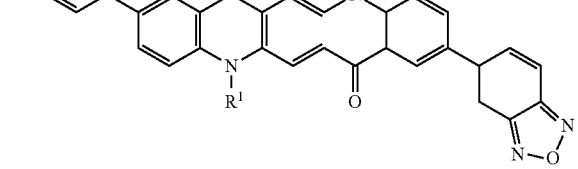

-continued

[Chemical Formula 1d]

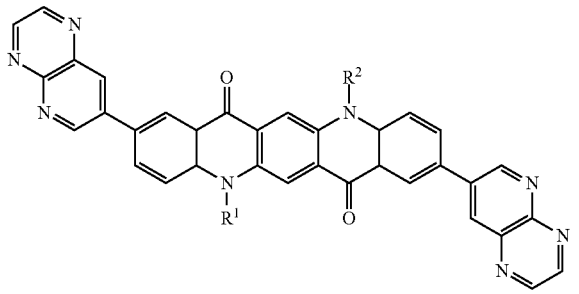

[Chemical Formula 1e]

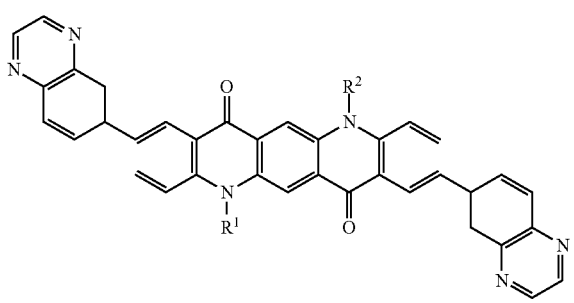

wherein, in the Chemical Formulae 1a to 1e,
each of $R^1$ and $R^2$ are independently hydrogen, a substituted or unsubstituted $C_1$ to $C_{30}$ alkyl group, a substituted or unsubstituted $C_6$ to $C_{30}$ aryl group, a substituted or unsubstituted $C_3$ to $C_{30}$ heteroaryl group, and a combination thereof.

7. The organic photoelectronic device of claim 1, wherein the compound represented by the Chemical Formula 1 is a p-type semiconductor, and
the compound represented by the Chemical Formula 3 is an n-type semiconductor.

8. The organic photoelectronic device of claim 1, wherein the active layer selectively absorbs light in a green wavelength region.

9. The organic photoelectronic device of claim 1, wherein the active layer has a maximum absorption peak in a wavelength region of about 500 nm to about 600 nm.

10. The organic photoelectronic device of claim 1, wherein the active layer includes an intrinsic layer including the compound represented by the Chemical Formula 1 or 2 and the compound represented by the Chemical Formula 3 at a ratio of about 1:100 to about 100:1.

11. The organic photoelectronic device of claim 10, wherein the active layer includes an intrinsic layer including the compound represented by the Chemical Formula 1 and the compound represented by the Chemical Formula 3 at a ratio of about 1:10 to about 10:1.

12. The organic photoelectronic device of claim 10, wherein the active layer further comprises a p-type layer including the compound represented by the Chemical Formula 1.

13. The organic photoelectronic device of claim 10, wherein the active layer further comprises an n-type layer including the compound represented by the Chemical Formula 3.

14. The organic photoelectronic device of claim 10, wherein the active layer comprises:
a p-type layer on one side of the intrinsic layer, the p-type layer including the compound represented by the Chemical Formula 1; and
an n-type layer on the other side of the intrinsic layer, the n-type layer including the compound represented by the Chemical Formula 3.

15. The organic photoelectronic device of claim 1, wherein the active layer includes a p-type layer including the compound represented by the Chemical Formula 1 and an n-type layer including the compound represented by the Chemical Formula 3.

16. The organic photoelectronic device of claim 1, further comprising:
a charge auxiliary layer between at least one of the first electrode and the active layer, and the second electrode and the active layer.

17. The organic photoelectronic device of claim 1, wherein the first electrode is an anode and the second electrode is a cathode.

18. An image sensor comprising the organic photoelectronic device according to claim 1.

19. The image sensor of claim 18, further comprising:
a semiconductor substrate including a photo-sensing device;
a lower insulation layer on the semiconductor substrate;
a color filter on the lower insulation layer; and
an upper insulation layer on the color filter,
wherein the organic photoelectronic device is on the upper insulation layer.

* * * * *